(12) United States Patent
Inokuchi et al.

(10) Patent No.: US 10,026,465 B2
(45) Date of Patent: Jul. 17, 2018

(54) NONVOLATILE MEMORY

(71) Applicant: KABUSHIKI KAISHA TOSHIBA, Minato-ku (JP)

(72) Inventors: Tomoaki Inokuchi, Yokohama (JP); Naoharu Shimomura, Tokyo (JP); Katsuhiko Koui, Yokohama (JP); Yuuzo Kamiguchi, Yokohama (JP); Satoshi Shirotori, Yokohama (JP); Kazutaka Ikegami, Inagi (JP); Hiroaki Yoda, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/453,176

(22) Filed: Mar. 8, 2017

(65) Prior Publication Data
US 2018/0040359 A1 Feb. 8, 2018

(30) Foreign Application Priority Data
Aug. 5, 2016 (JP) ................... 2016-155105

(51) Int. Cl.
G11C 11/00 (2006.01)
G11C 11/16 (2006.01)

(52) U.S. Cl.
CPC ........ G11C 11/1675 (2013.01); G11C 11/161 (2013.01); G11C 11/1673 (2013.01)

(58) Field of Classification Search
CPC . G11C 11/16; G11C 11/1675; G11C 11/1673; G11C 11/1659; G11C 11/15;
(Continued)

(56) References Cited

U.S. PATENT DOCUMENTS 6,169,688 B1 * 1/2001 Noguchi ................. G11C 11/15
365/173
9,076,537 B2 7/2015 Khvalkovskiy et al.
(Continued)

FOREIGN PATENT DOCUMENTS

JP 2014-45196 A 3/2014
JP 2014-179618 A 9/2014
(Continued)

OTHER PUBLICATIONS

H.Yoda, et al., "Progress of STT-MRAM Technology and the Effect on Normally-off Computing Systems" 2012 IEEE International Electron Devices Meeting (IEDM), Dec. 10-13, 2012, pp. 11.3.1-11.3.4.
(Continued)

Primary Examiner — Thong Q Le
(74) Attorney, Agent, or Firm — Oblon, McClelland, Maier & Neustadt, L.L.P.

(57) ABSTRACT

According to one embodiment, a nonvolatile memory includes a conductive line including a first portion, a second portion and a third portion therebetween, a storage element including a first magnetic layer, a second magnetic layer and a nonmagnetic layer therebetween, and the first magnetic layer being connected to the third portion, and a circuit flowing a write current between the first and second portions, applying a first potential to the second magnetic layer, and blocking the write current flowing between the first and second portions after changing the second magnetic layer from the first potential to a second potential.

20 Claims, 28 Drawing Sheets

(58) Field of Classification Search
CPC .............. G11C 13/0069; G11C 11/161; G11C 2213/79; G11C 11/1657; G11C 13/0004; G11C 29/028; G11C 13/004; G11C 11/1697
USPC ....... 365/158, 171, 148, 189.16, 230.03, 63, 365/189.07, 189.011, 222, 154, 232, 123, 365/145, 173, 185.03, 185.18
See application file for complete search history.

(56) References Cited

U.S. PATENT DOCUMENTS

| 9,076,541 | B2 | 7/2015 | Ong et al. |
| 2014/0010004 | A1 | 1/2014 | Suzuki |
| 2014/0056060 | A1 | 2/2014 | Khvalkovskiy et al. |
| 2014/0056061 | A1 | 2/2014 | Khvalkovskiy et al. |
| 2014/0269032 | A1 | 9/2014 | Ong et al. |
| 2016/0225423 | A1 | 8/2016 | Naik et al. |
| 2016/0276006 | A1 | 9/2016 | Ralph et al. |
| 2017/0169872 | A1 | 6/2017 | Yoda et al. |

FOREIGN PATENT DOCUMENTS

| JP | 2017-112351 A | 6/2017 |
| WO | WO 2012/127722 A1 | 9/2012 |

OTHER PUBLICATIONS

H.Yoda, et al., "The Progresses of MRAM as a Memory to Save Energy Consumption and its Potential for Further Reduction" 2015 Symposium on VLSI Technology (VLSI Technology), Digest of Technical Papers, Jun. 16-18, 2015, pp. T104-T105.

Luqiao Liu, et al., "Spin-Torque Switching with the Giant Spin Hall Effect of Tantalum" Science, vol. 336, No. 6081, May 4, 2012, pp. 555-558 and cover page.

* cited by examiner

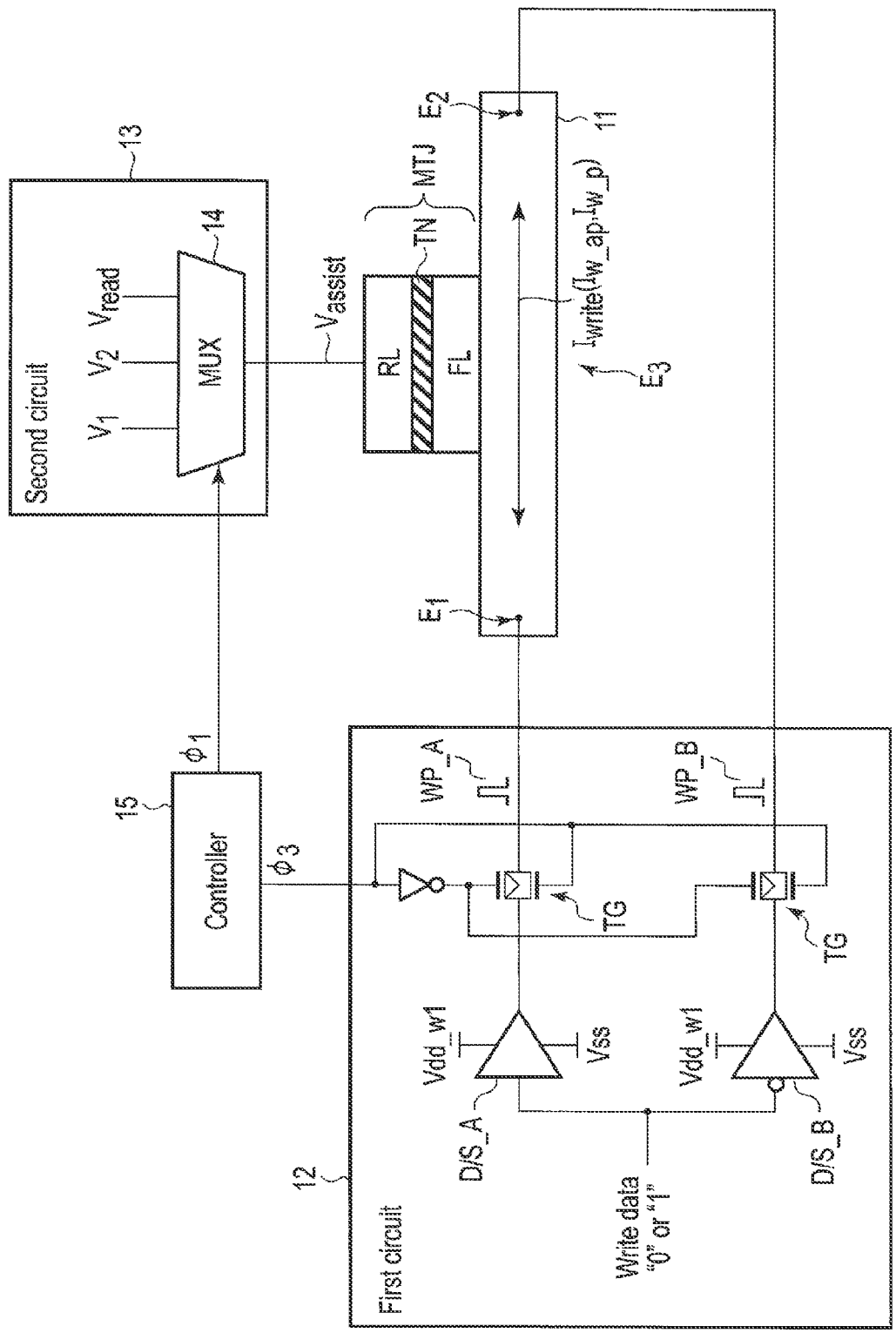
F I G. 1

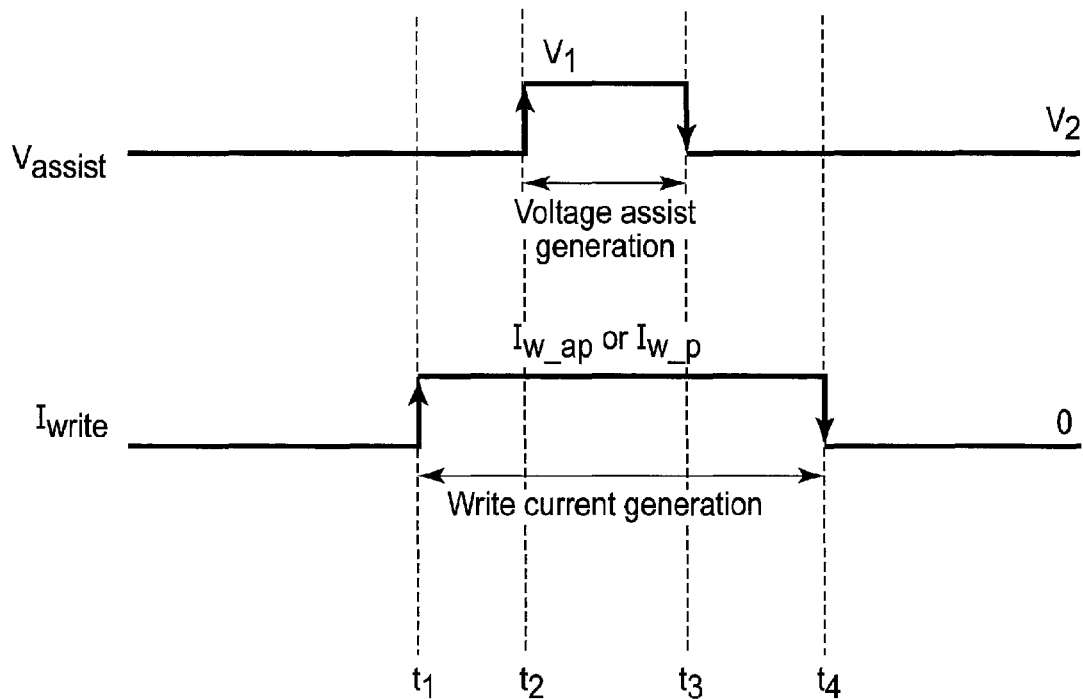
F I G. 2
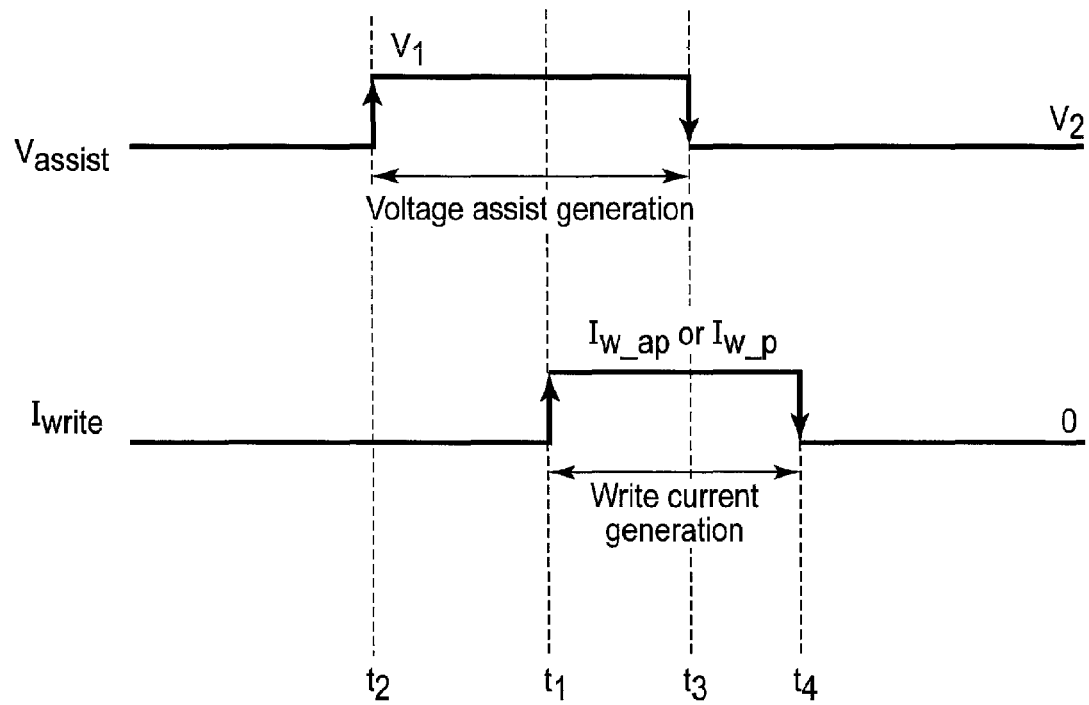
F I G. 3

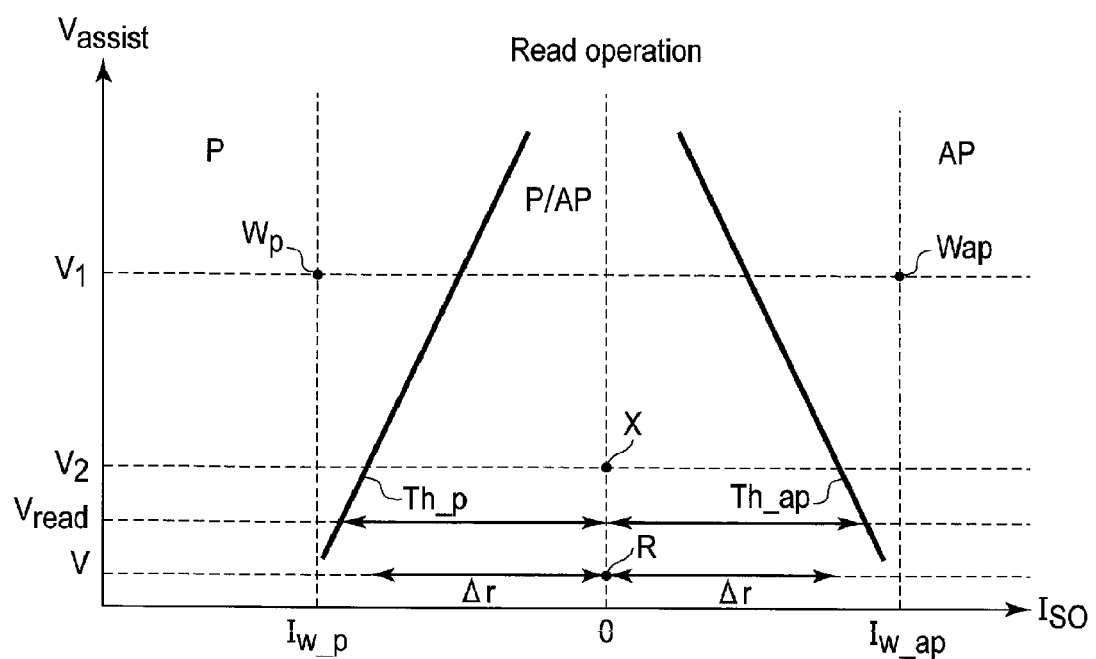
F I G. 14

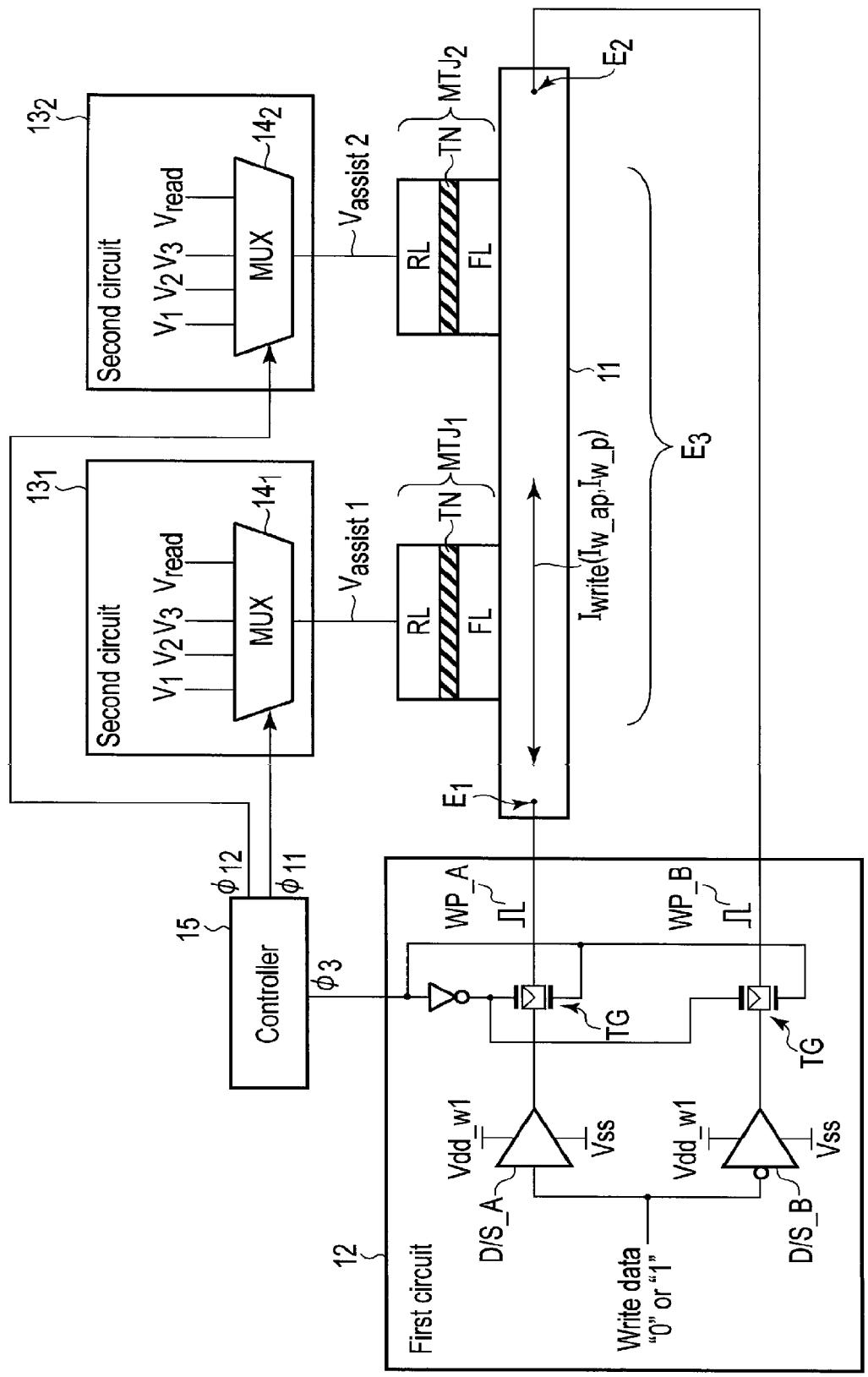
F I G. 15

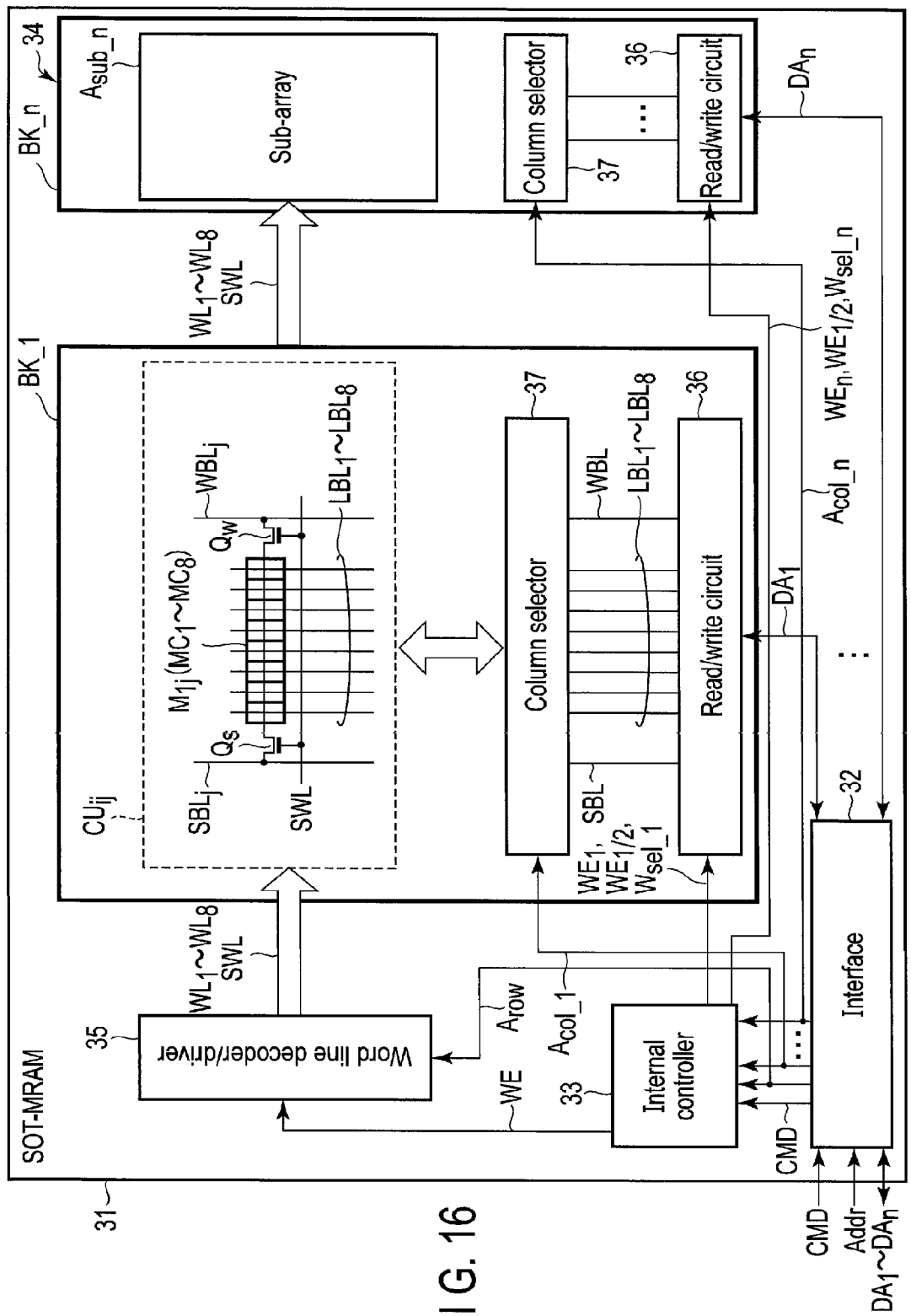
F I G. 16

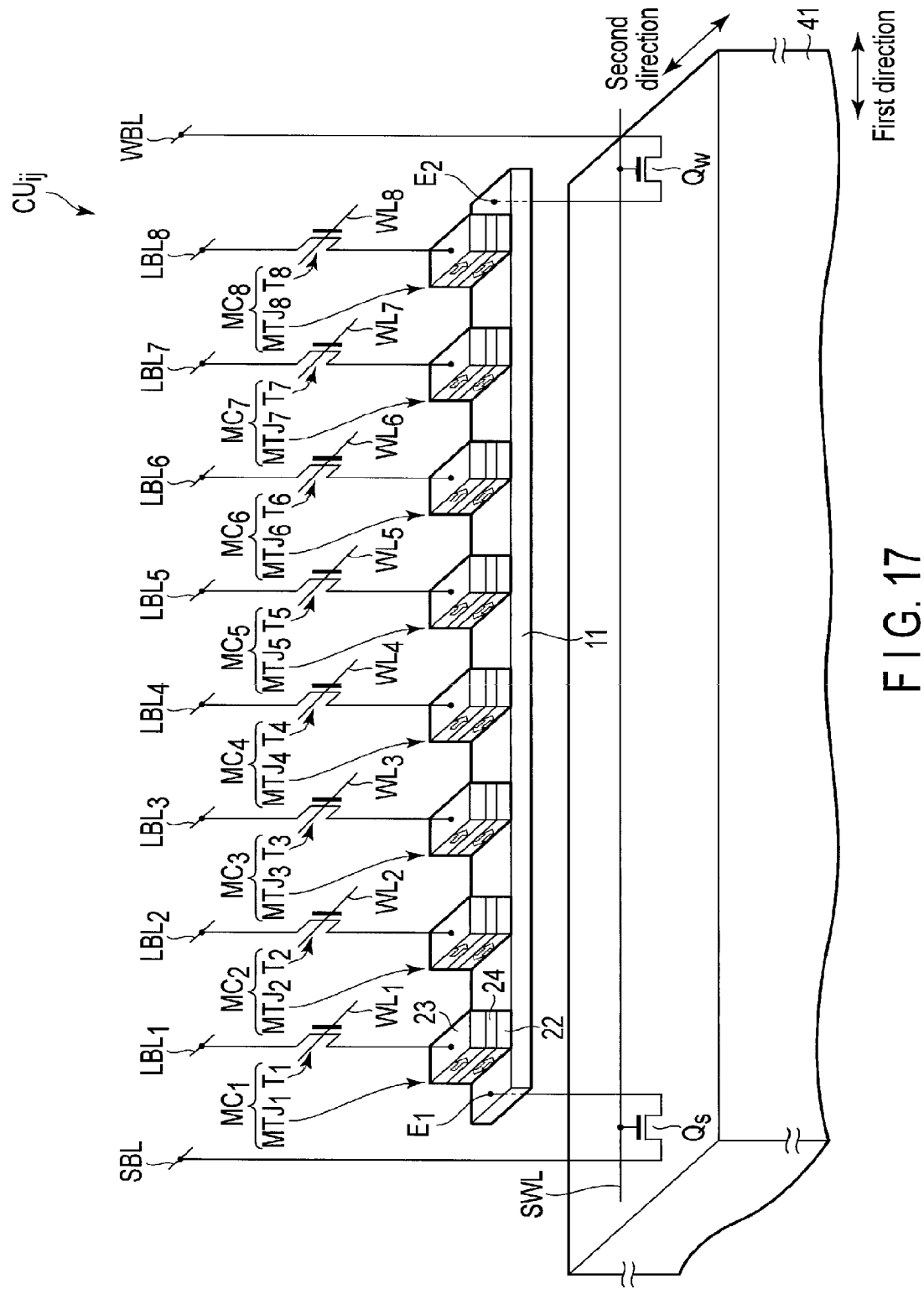
F I G. 17

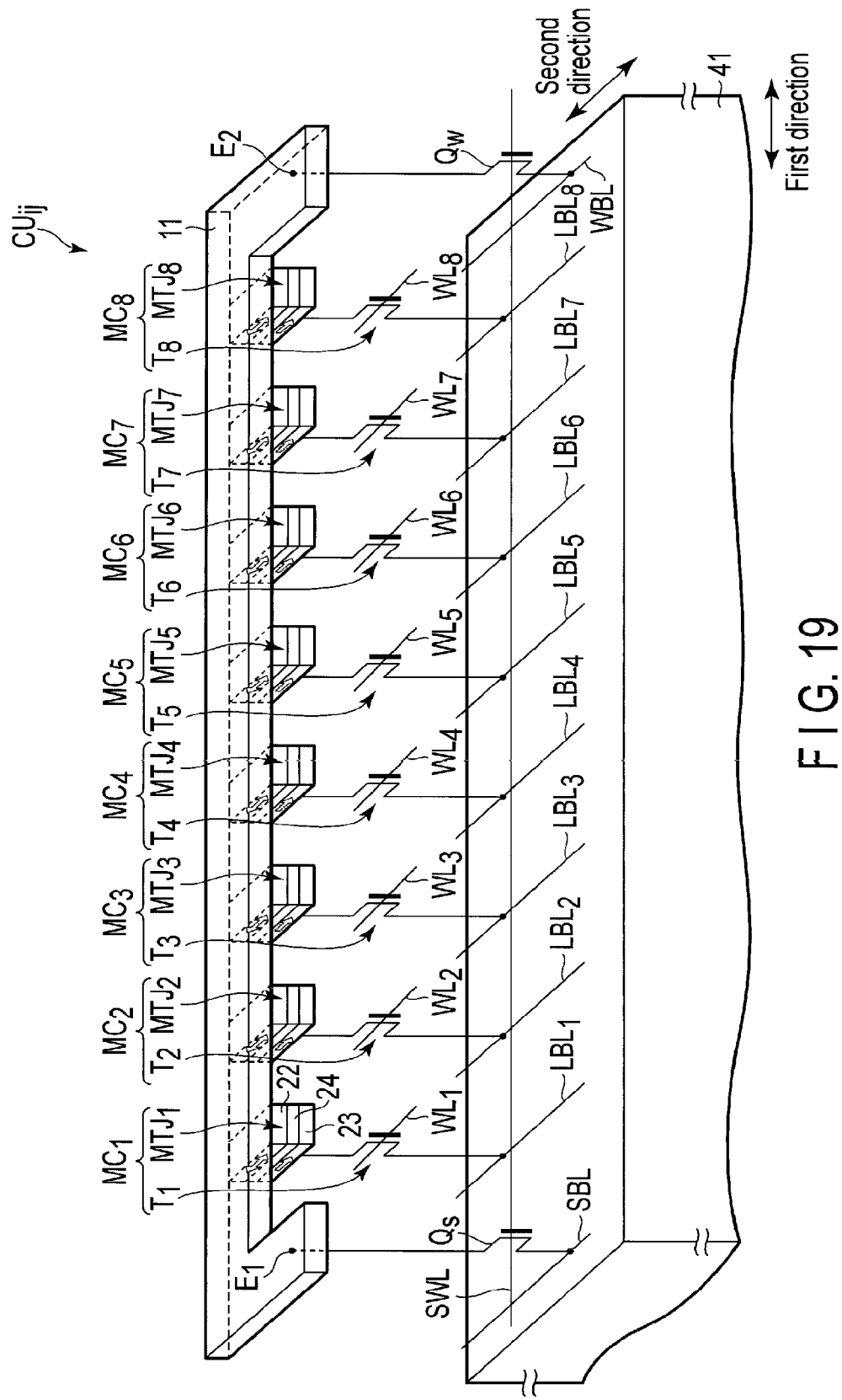
F I G. 19

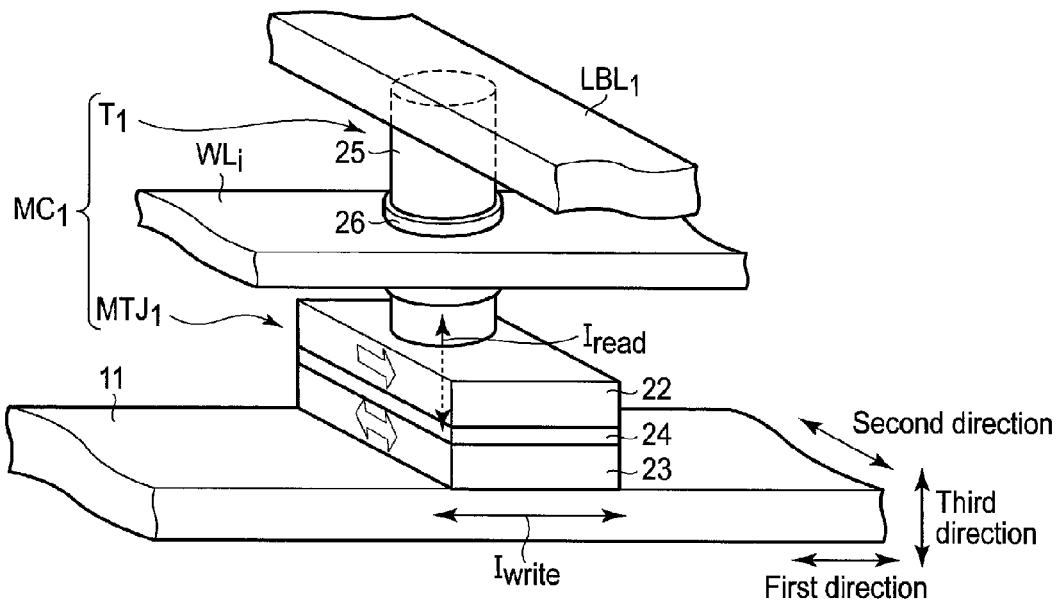
F I G. 20
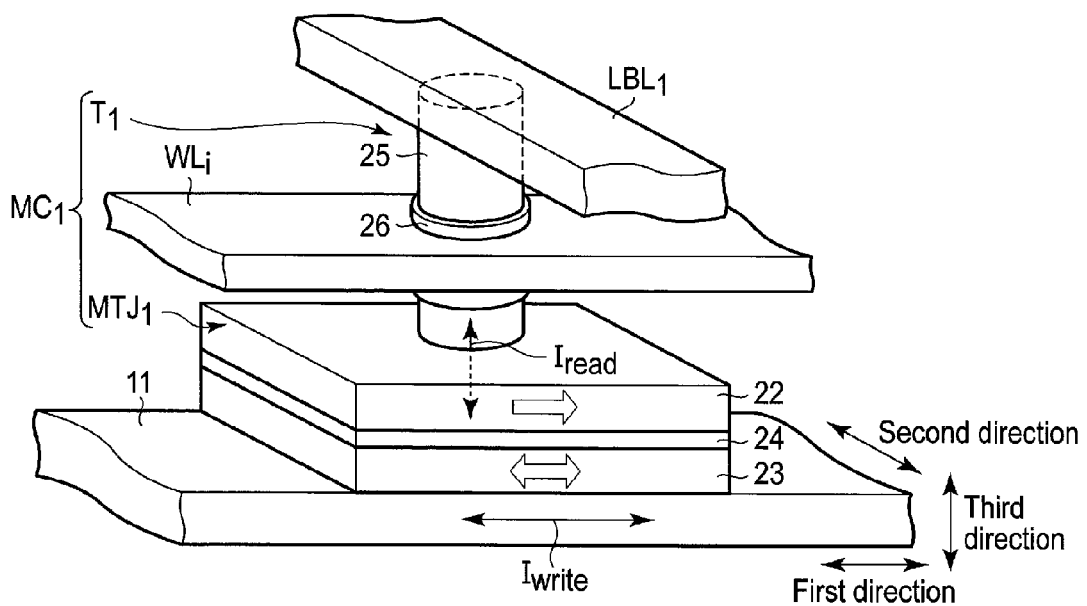
F I G. 21

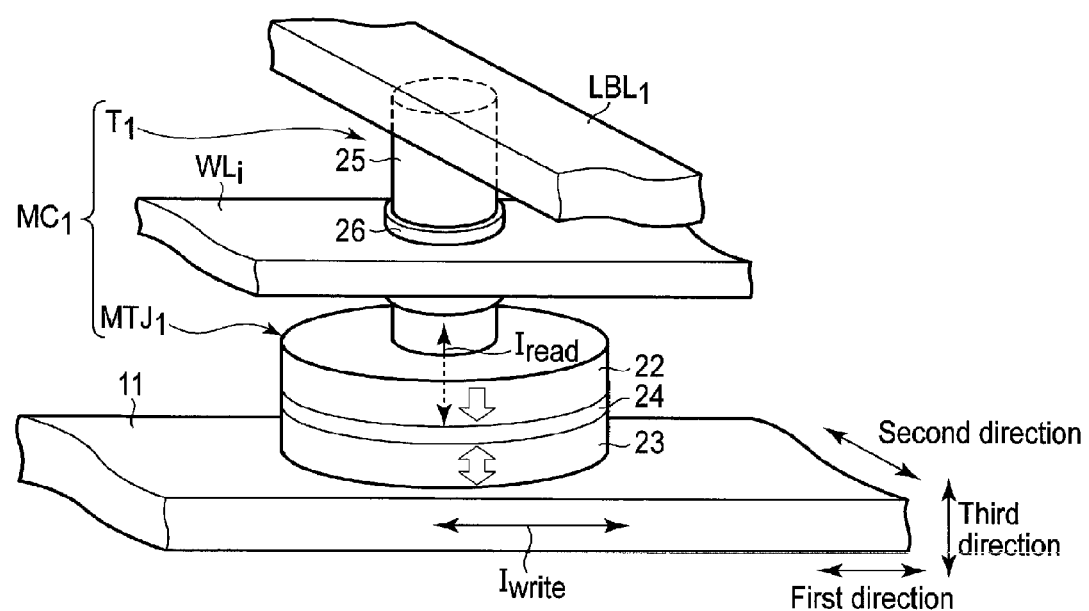
F I G. 22

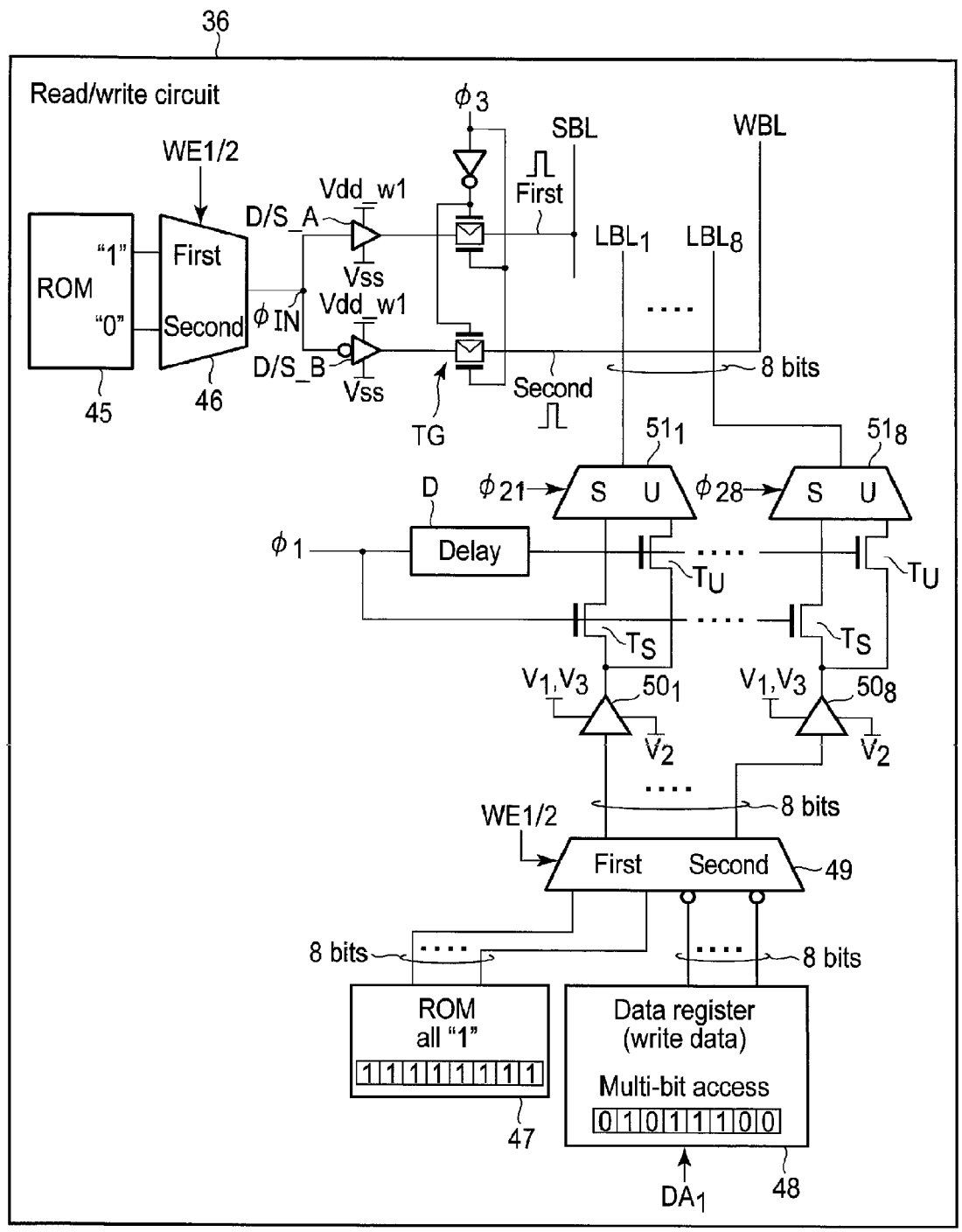
F I G. 23

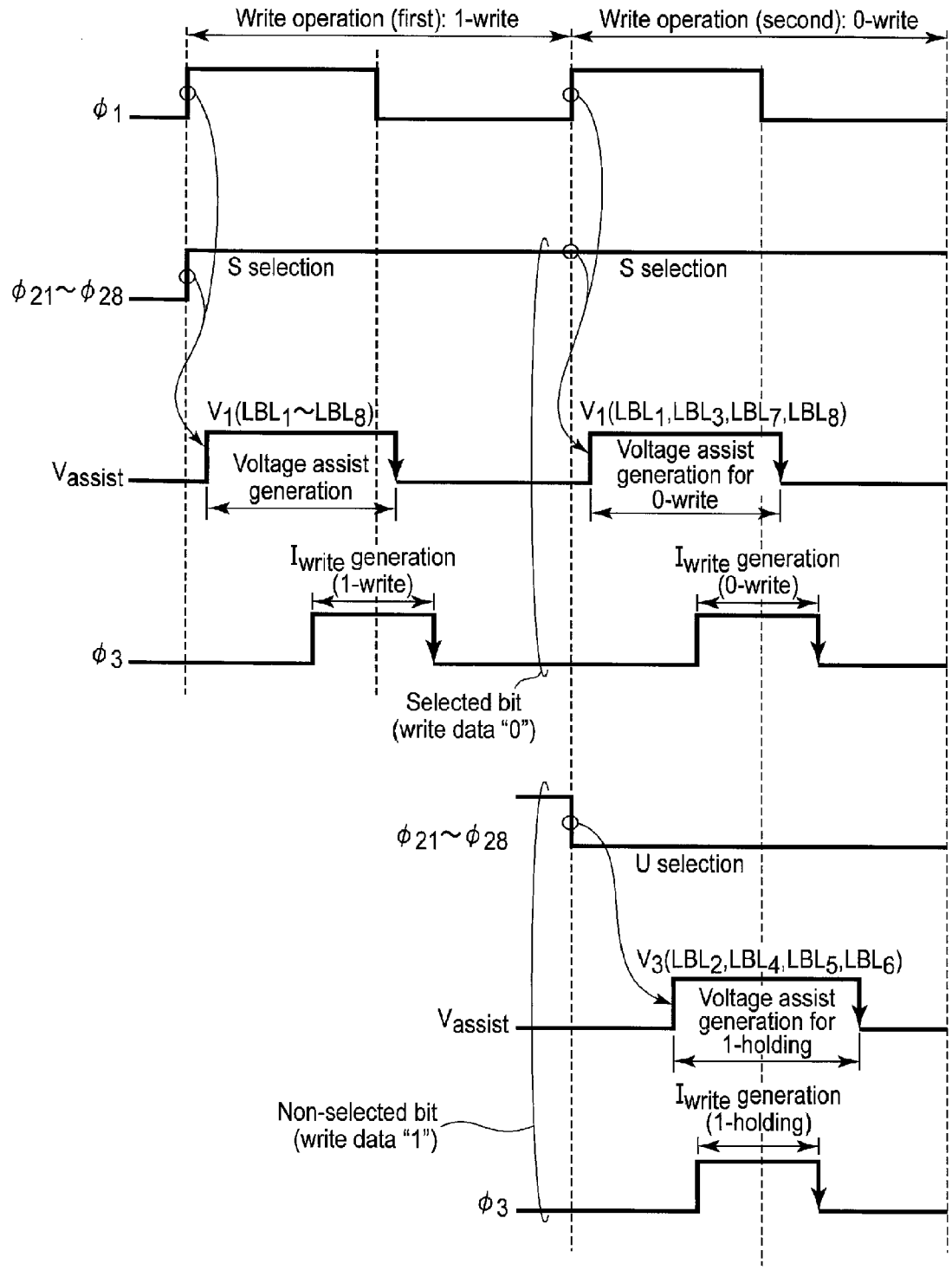
F I G. 26

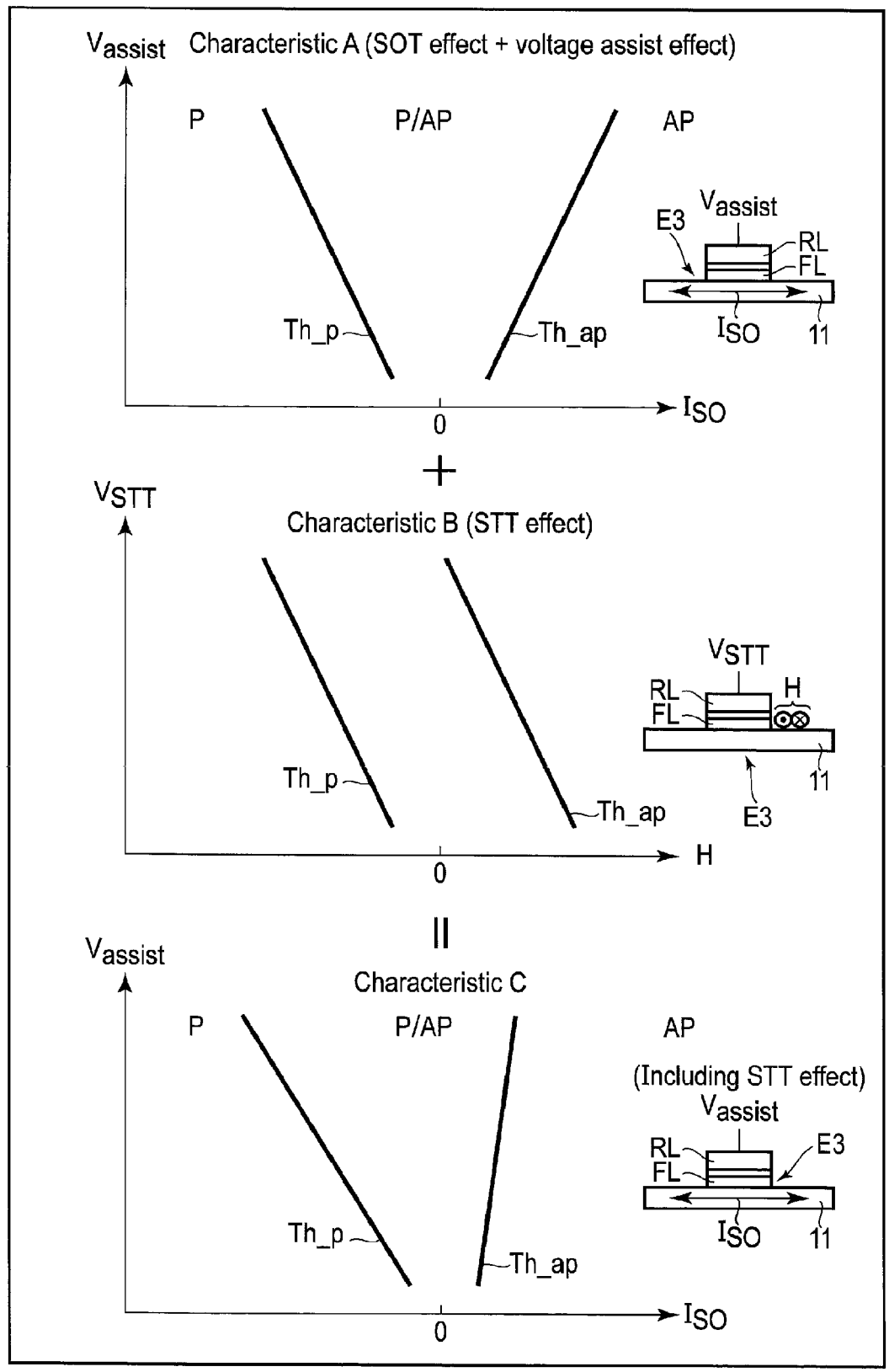
F I G. 27

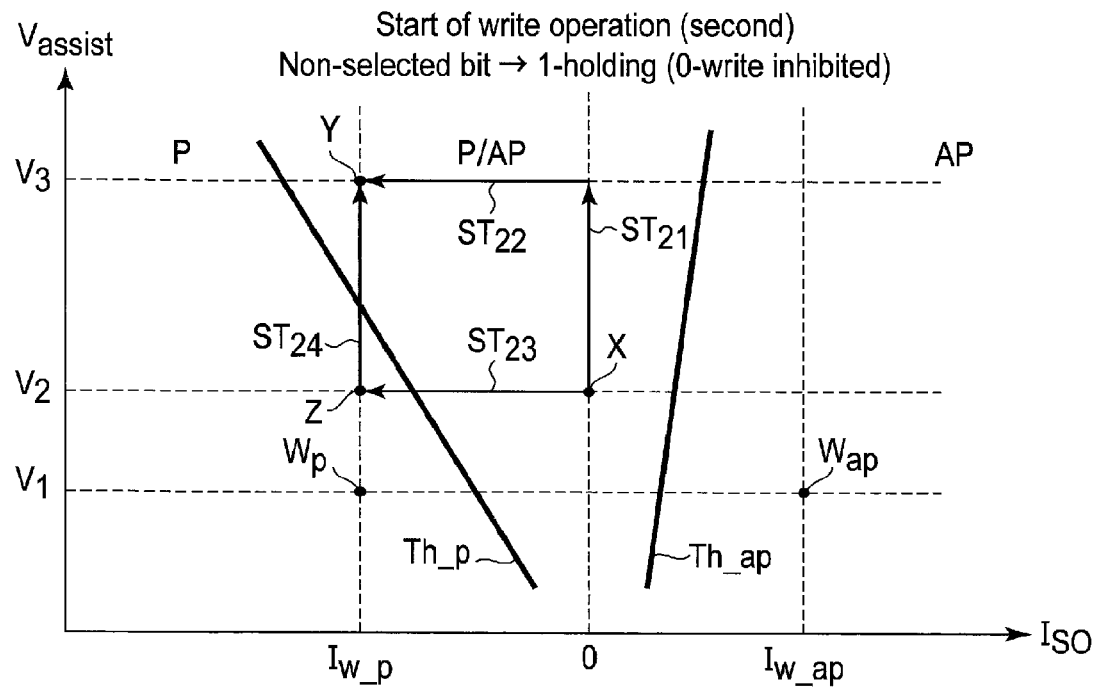
F I G. 32
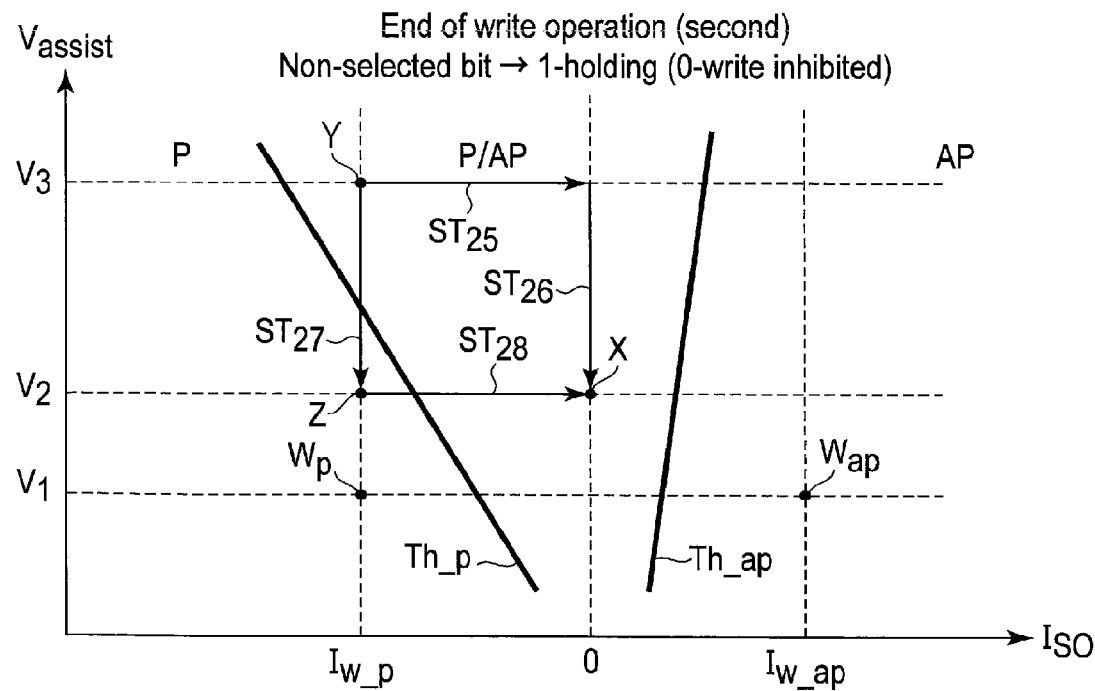
F I G. 33

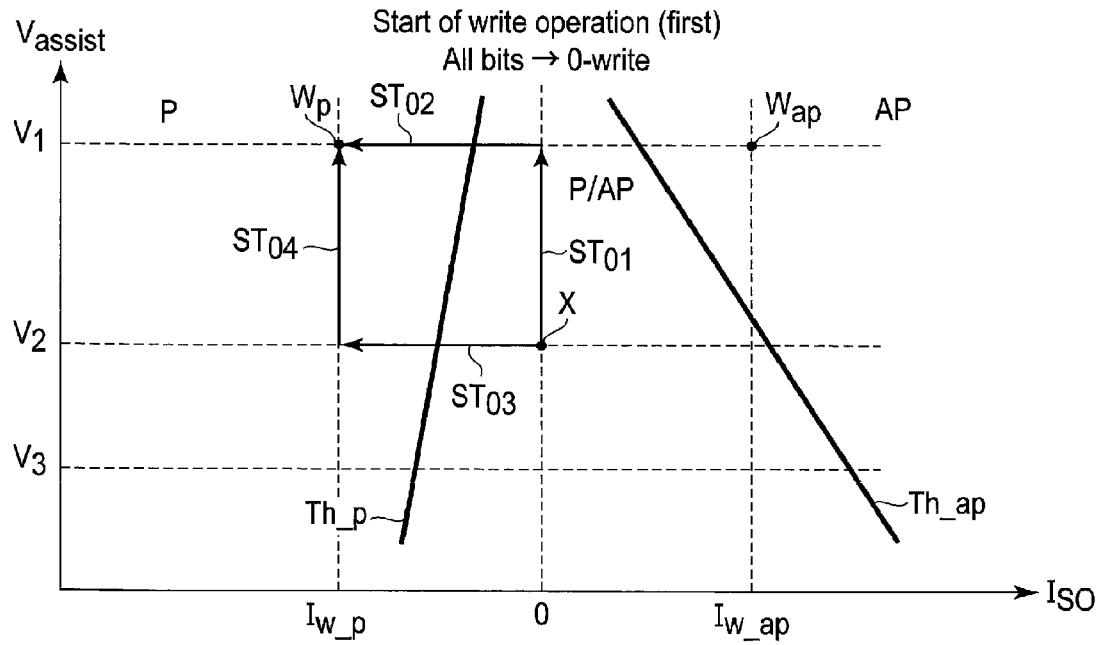
F I G. 35
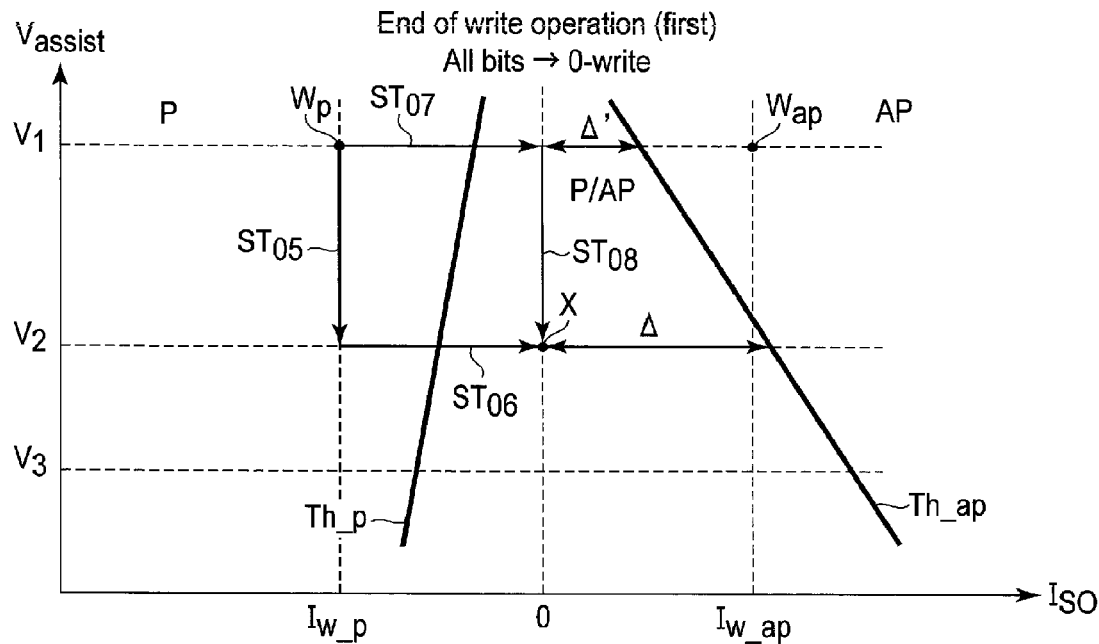
F I G. 36

NONVOLATILE MEMORY

CROSS-REFERENCE TO RELATED APPLICATIONS

This application is based upon and claims the benefit of priority from Japanese Patent Application No. 2016-155105, filed Aug. 5, 2016, the entire contents of which are incorporated herein by reference.

FIELD

Embodiments described herein relate generally to a nonvolatile memory.

BACKGROUND

Currently, nonvolatile memories such as static random access memory (SRSM) and dynamic random access memory (DRAM) are mainstream as a working memory used in various systems. However, these memories have a problem of high power consumption.

Thus, attempts to replace the working memory used in various system and further, storage memories with a magnetic memory that is faster and consumes less power have been examined. However, it is necessary to reduce a write error rate to apply magnetic memories to various systems.

BRIEF DESCRIPTION OF THE DRAWINGS

FIG. 1 shows a magnetic memory according to a first embodiment;

FIG. 2 is a diagram showing a relationship between $V_{assist}$ and $I_{write}$;

FIG. 3 is a diagram showing a relationship between $V_{assist}$ and $I_{write}$;

FIG. 14 is a diagram showing the read operation in the second characteristic;

FIG. 15 is a diagram showing a magnetic memory according to a second embodiment;

FIG. 16 is a diagram showing a magnetic memory according to a third embodiment;

FIG. 17 is a diagram showing an example of a device structure of a unit cell;

FIG. 19 is a diagram showing an example of the device structure of the unit cell;

FIG. 20 is a diagram showing an example of the device structure of a memory cell;

FIG. 21 is a diagram showing an example of the device structure of the memory cell;

FIG. 22 is a diagram showing an example of the device structure of the memory cell;

FIG. 23 is a diagram showing an example of a read/write circuit;

FIG. 26 is a waveform chart showing changes of main signals in a write operation;

FIG. 27 is a diagram showing characteristics of a magnetic memory according to a fourth embodiment;

FIG. 32 is a diagram showing the start of the write operation (second) of a non-selected bit;

FIG. 33 is a diagram showing the end of the write operation (second) of the non-selected bit;

FIG. 35 is a diagram showing the start of the write operation (first);

FIG. 36 is a diagram showing the end of the write operation (first);

DETAILED DESCRIPTION

Figure 4:
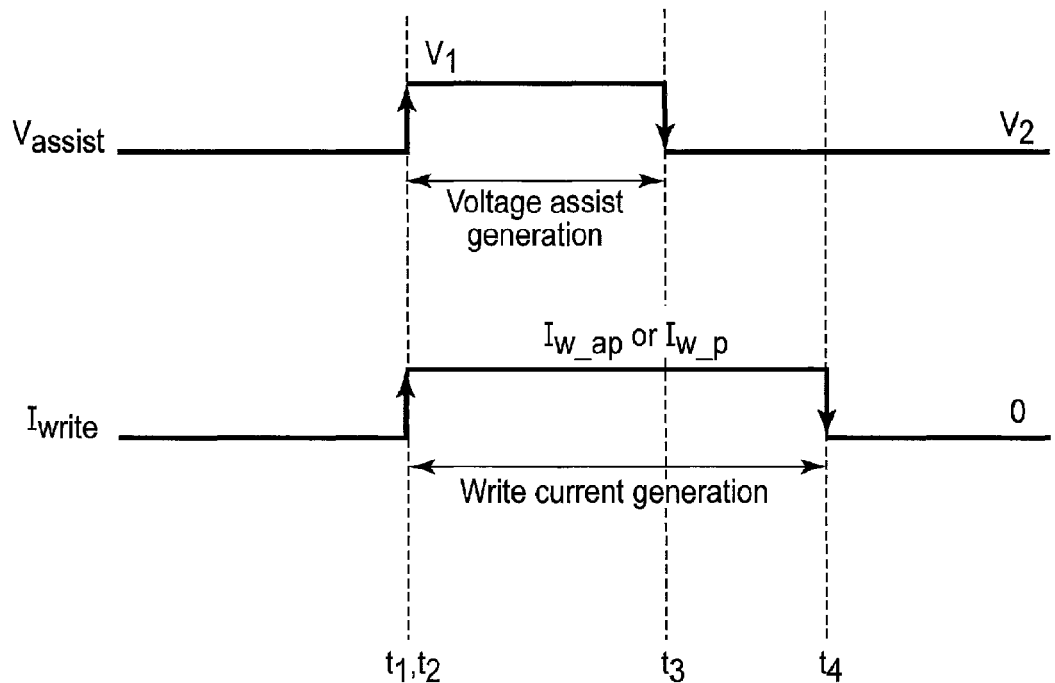
FIG. 4 is a diagram showing a relationship between $V_{assist}$ and $I_{write}$.

In general, according to one embodiment, a nonvolatile memory comprises: a conductive line including a first portion, a second portion and a third portion therebetween; a storage element including a first magnetic layer, a second magnetic layer and a nonmagnetic layer therebetween, and the first magnetic layer being connected to the third portion; and a circuit flowing a write current between the first and second portions, applying a first potential to the second magnetic layer, and blocking the write current flowing between the first and second portions after changing the second magnetic layer from the first potential to a second potential.

Hereinafter, the embodiments will be described with reference to the drawings.

First Embodiment

FIG. 1 shows a magnetic memory according to a first embodiment.

The magnetic memory is what is called a SOT (Spin-Orbit Torque) magnetic memory.

A conductive wire 11 has a first portion $E_1$, a second portion $E_2$, and a third portion $E_3$ therebetween.

For example, the first and second portions $E_1$, $E_2$ correspond to two ends of the conductive wire 11 in a direction in which the conductive wire 11 extends and the third portion $E_3$ corresponds to a center portion of the conductive wire 11.

A storage element MTJ is a 2-terminal element having a first terminal and a second terminal.

For example, the storage element MTJ is a magnetoresistive effect element. In this case, the storage element MTJ includes a first magnetic layer (first terminal) FL having a variable magnetization direction, a second magnetic layer (second terminal) RL having an invariable magnetization direction, and a nonmagnetic layer (tunnel barrier layer) TN between the first and second magnetic layers FL, RL and the first magnetic layer FL is connected to the third portion $E_3$.

A first circuit 12 can generate one of a first current $I_{w\_ap}$ and a second current $I_{w\_p}$ opposite to each other between the first and second portions $E_1$, $E_2$.

For example, the first circuit 12 includes driver/sinkers D/S_A, D/S_B capable of generating one of the first current $I_{w\_ap}$ and the second current $I_{w\_p}$ between the first and second portions $E_1$, $E_2$ in accordance with write data (0 or 1) and a transfer gate TG.

In this case, when the write data is 1, for example, the driver/sinker D/S_A outputs $V_{dd\_W1}$ (positive potential) and the driver sinker D/S_B outputs a ground potential $V_{ss}$. When a control signal $\varphi_3$ becomes active (1), the transfer gate TG is turned on and a write pulse WP_A is generated. Thus, the first current $I_{write}$ (=$I_{w\_ap}$) flows from the first portion $E_1$ toward the second portion $E_2$.

Also, when the write data is 0, for example, the driver/sinker D/S_B outputs $V_{dd\_W1}$ (positive potential) and the driver sinker D/S_A outputs the ground potential $V_{ss}$. When the control signal $\varphi_3$ becomes active (1), the transfer gate TG is turned on and a write pulse WP_B is generated. Thus, the second current $I_{write}$ (=$I_{w\_p}$) flows from the second portion $E_2$ toward the first portion $E_1$.

In a write operation, a second circuit 13 can apply one of a first potential $V_1$ and a second potential $V_2$ that are difficult from each other to the second magnetic layer (second terminal) RL of the storage element MTJ. Also, in a read operation, the second circuit 13 can apply a read potential $V_{read}$ to the second magnetic layer (second terminal) RL of the storage element MTJ.

For example, the second circuit 13 includes a selector 14, for example, a multiplexer MUX that outputs one of the first potential $V_1$, the second potential $V_2$, and the read potential $V_{read}$ based on a control signal $\varphi_1$. The potential output from the selector 14 is applied to the second magnetic layer (second terminal) RL of the storage element MTJ.

In this case, the control signal $\varphi_1$ is active (01) or non-active (00) in a write operation. When the control signal $\varphi_1$ is active (01), for example, the selector 14 selects the first potential $V_1$. The first potential $V_1$ is, for example, a negative potential. The first potential $V_1$ is different from the potential of the third portion $E_3$ when the first or second current $I_{write}$ ($I_{w\_ap}$ or $I_{w\_p}$) flows between the first and second portions $E_1$, $E_2$.

That is, the first potential $V_1$ is an assist potential $V_{assist}$ to generate a voltage that assists in reversing magnetization of the first magnetic layer FL between the second magnetic layer RL of the storage element MTJ and the third portion $E_3$ of the conductive wire 11 when the first or second current $I_{write}$ ($I_{w\_ap}$ or $I_{w\_p}$) flows between the first and second portions $E_1$, $E_2$.

When the control signal $\varphi_1$ is non-active (00), for example, the selector 14 selects the second potential $V_2$. The second potential $V_2$ is, for example, the ground potential $V_{ss}$. The second potential $V_2$ is a potential on standby, that is, when none of the write operation and read operation is performed.

Also, the control signal $\varphi_1$ is active (10) or non-active (00) in a read operation. When the control signal $\varphi_1$ is active (10), for example, the selector 14 selects the read potential $V_{read}$. The read potential $V_{read}$ is, for example, a positive potential.

A controller 15 controls read operations and write operations.

In a write operation, for example, the controller 15 makes the control signal $\varphi_1$ active (01)/non-active (00) and applies the first potential $V_1$ or the second potential $V_2$ to the second magnetic layer RL of the storage element MTJ. Also, the controller 15 makes the control signal $\varphi_3$ active/non-active and generates the first or second current $I_{write}$ ($I_{w\_ap}$ or $I_{w\_p}$) between the first and second portions $E_1$, $E_2$.

In this case, the controller 15 controls the potential of the second magnetic layer RL of the storage element MTJ and the first or second current $I_{write}$ ($I_{w\_ap}$ or $I_{w\_p}$) in the order below.

First, for example, the controller 15 writes first data (1) or second data (0) into the storage element MTJ by passing the first or second current $I_{write}$ ($I_{w\_ap}$ or $I_{w\_p}$) between the first and second portions $E_1$, $E_2$ and applying the first potential $V_1$ to the second magnetic layer (second terminal) RL of the storage element MTJ.

For example, the first data is written into the storage element MTJ when the first current $I_{w\_ap}$ is passed to between the first and second portions $E_1$, $E_2$ and the second data is written into the storage element MTJ when the second current $I_{w\_ap}$ is passed to between the first and second portions $E_1$, $E_2$.

Here timing t1 when the first or second current $I_{write}$ ($I_{w\_ap}$ or $I_{w\_p}$) is passed to between the first and second portions $E_1$, $E_2$ and timing t2 when the first potential $V_1$ is applied to the second magnetic layer RL of the storage element MTJ may be the same or different.

For example, as shown in FIG. 2, the timing t1 may be before the timing t2 or, as shown in FIG. 3, the timing t1 may be after the timing t2. Also, as shown in FIG. 4, the timing t1 and the timing t2 may be the same.

Next, after writing the first data into the storage element MTJ, the controller 15 changes the potential of the second magnetic layer (second terminal) RL of the storage element MTJ from the first potential $V_1$ to the second potential $V_2$. Then, the controller 15 shuts off the first or second current $I_{write}$ ($I_{w\_ap}$ or $I_{w\_p}$) between the first and second portions $E_1$, $E_2$.

That is, for example, as shown in FIGS. 2 to 4, timing t3 to change the potential of the second magnetic layer RL of the storage element MTJ from the first potential $V_1$ to the second potential $V_2$ is before timing t4 when the first or second current $I_{write}$ ($I_{w\_ap}$ or $I_{w\_p}$) between the first and second portions $E_1$, $E_2$ is shut off.

In a write operation, for example, the controller 15 makes the control signal $\varphi_1$ active (10)/non-active (00) and applies the read potential $V_{read}$ to the second magnetic layer RL of the storage element MTJ. In a read operation, a read current flows between the second magnetic layer RL of the storage element MTJ and the third portion $E_3$ of the conductive wire 11.

That is, the path through which the read current flows as a write current is different from the path through which the first or second current $I_{write}$ ($I_{w\_ap}$ or $I_{w\_p}$) flows. Thus, even if the read current is set to be relatively large, a situation in which an erroneous write is caused by the read current can be inhibited.

To increase the effect still more, the second potential $V_2$ is desirably between the first potential $V_1$ and the read potential $V_{read}$. This will be described below.

In the magnetic memory in FIG. 1, the conductive wire 11 desirably has a material and a thickness capable of controlling the magnetization direction of the first magnetic layer FL of the storage element MTJ by the spin orbit coupling or Rashba effect. For example, the conductive wire 11 contains a metal such as tantalum (Ta), tungsten (W), or platinum (Pt) and has a thickness of 5 to 20 nm (for example, about 10 nm).

In this case, if the first or second current $I_{write}$ ($I_{w\_ap}$ or $I_{w\_p}$) is passed to the conductive wire 11, SOT (Spin-Orbit Torque) acts on the first magnetic layer (storage layer) FL of the storage element MTJ and thus, the magnetization direction of the first magnetic layer (storage layer) FL can be reversed. If, at this point, the above assist voltage is applied to the storage element MTJ, magnetic characteristics of the first magnetic layer FL are modulated by the field effect and the first or second current $I_{write}$ ($I_{w\_ap}$ or $I_{w\_p}$) needed to reverse the magnetization direction of the first magnetic layer FL can be made smaller.

Such a situation is shown in FIGS. 5 to 14.

That is, as shown in FIGS. 5 to 14, a first threshold line Th_p showing a boundary of whether the relation of magnetization directions of the first and second magnetic layers FL, RL is set to a parallel state and a second threshold line Th_ap showing a boundary of whether the relation of magnetization directions of the first and second magnetic layers FL, RL is set to an antiparallel state have fixed inclinations in a graph in which a current $I_{SO}$ flowing between the first and second portions $E_1$, $E_2$ is as the x axis and the potential $V_{assist}$ applied to the second magnetic layer RL of the storage element MTJ is set as the y axis.

When, for example, as shown in FIGS. 5 to 9, a negative potential is applied to the second magnetic layer RL of the storage element MTJ as $V_{assist}$, the current $I_{SO}$ needed to reverse the magnetization direction of the first magnetic layer FL becomes smaller, that is, a first case (first characteristic) where the first and second threshold lines Th_p, Th_ap are open upward is created.

Also, when, as shown in FIGS. 10 to 14, a positive potential is applied to the second magnetic layer RL of the storage element MTJ as $V_{assist}$, the current $I_{SO}$ needed to reverse the magnetization direction of the first magnetic layer FL becomes smaller, that is, a second case (second characteristic) where the first and second threshold lines Th_p, Th_ap are open downward is created.

However, in the first and second cases, a point X where the current $I_{SO}$ flowing between the first and second portions $E_1$, $E_2$ is 0 and the potential $V_{assist}$ applied to the second magnetic layer RL of the storage element MTJ is 0 is assumed to be the initial state.

Also in the present example, only a voltage assist effect caused by $V_{assist}$ is considered and the STT (Spin Transfer torque) effect accompanying $V_{assist}$ is not considered. The STT effect accompanying $V_{assist}$ will be described below.

Also, P indicates an area in which the relation of magnetization directions of the first and second magnetic layers FL, RL changes to a parallel state and AP indicates an area in which the relation of magnetization directions of the first and second magnetic layers FL, RL changes to an antiparallel state. P/AP indicates an area in which a parallel state is maintained when the relation of magnetization directions of the first and second magnetic layers FL, RL is the parallel state and an antiparallel state is maintained when the relation of magnetization directions of the first and second magnetic layers FL, RL is the antiparallel state.

The parallel state is a relation in which the magnetization directions of the first and second magnetic layers FL, RL are mutually the same direction and the antiparallel state is a relation in which the magnetization directions of the first and second magnetic layers FL, RL are mutually reverse directions.

Then, what can be known from the first case (FIGS. 5 to 9) is that the current $I_{SO}$ needed to reverse the magnetization direction of the first magnetic layer FL can be made smaller by applying a negative potential to the second magnetic layer RL of the storage element MTJ as $V_{assist}$.

Figure 5:
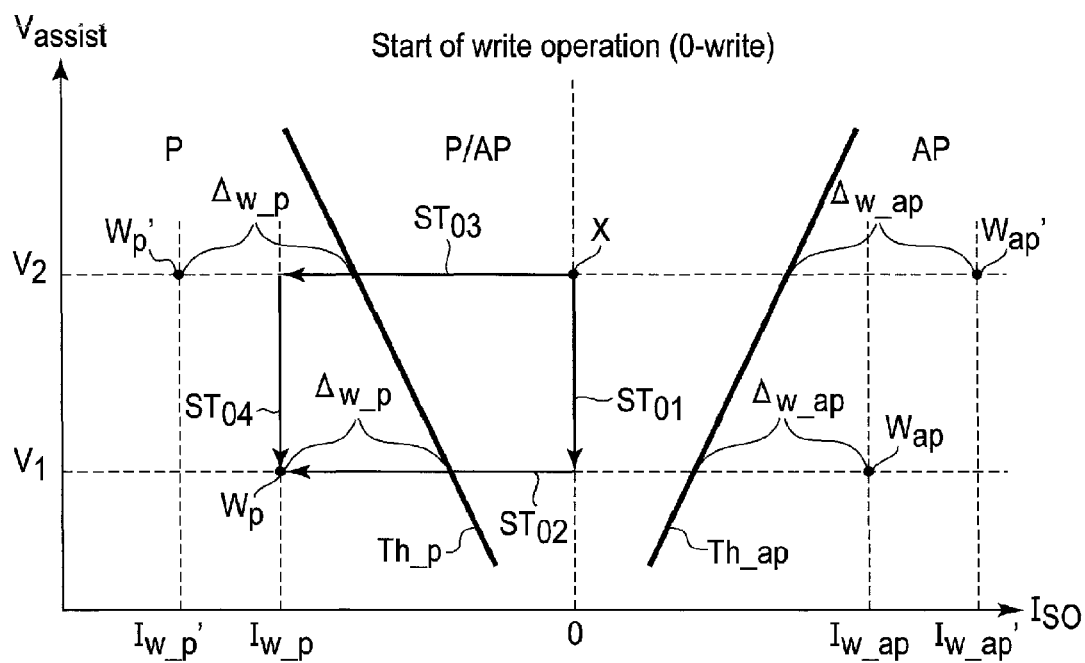
FIG. 5 is a diagram showing the start of a write operation (0-write) in a first characteristic.

When, for example, as shown in FIG. 5, margins $\Delta_{w\_p}$, $\Delta_{w\_ap}$ from the first and second threshold lines Th_p, Th_ap are secured in consideration of thermal disturbance in a write operation, write currents $I_{w\_p}$, $I_{w\_ap}$ when $V_{assist}$ is a negative potential are smaller than write currents $I_{w\_p}'$, $I_{w\_ap}'$ when $V_{assist}$ is 0V. That is, write points $W_p$, $W_{ap}$ can be set closer to 0 than write points $W_p'$, $W_{ap}'$.

Figure 8:
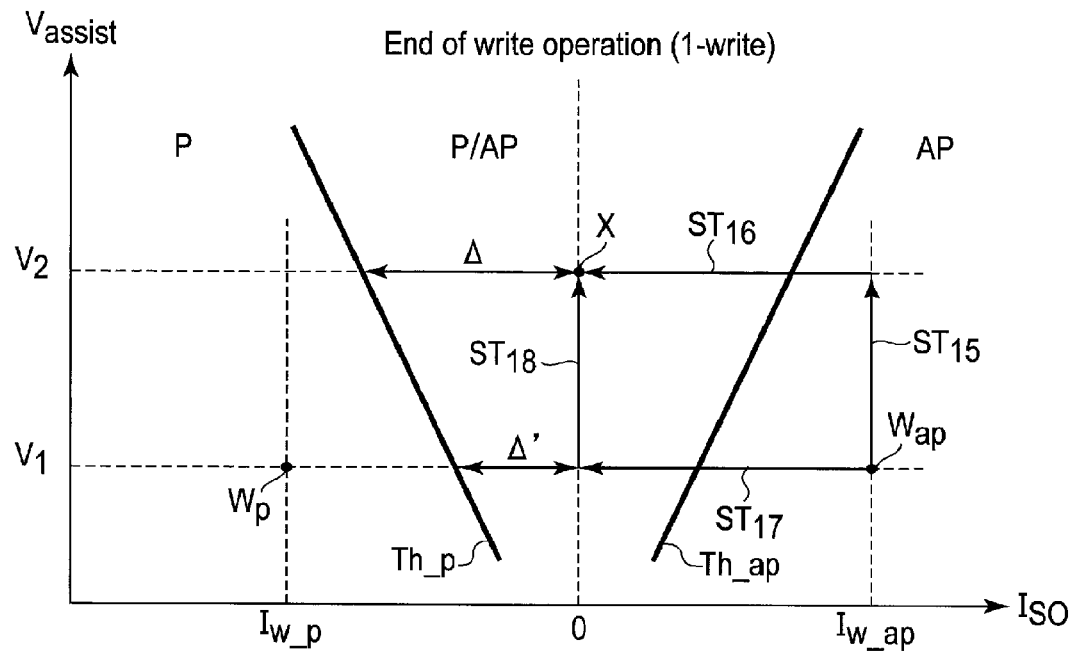
FIG. 8 is a diagram showing the end of the write operation (1-write) in the first characteristic.
Figure 9:
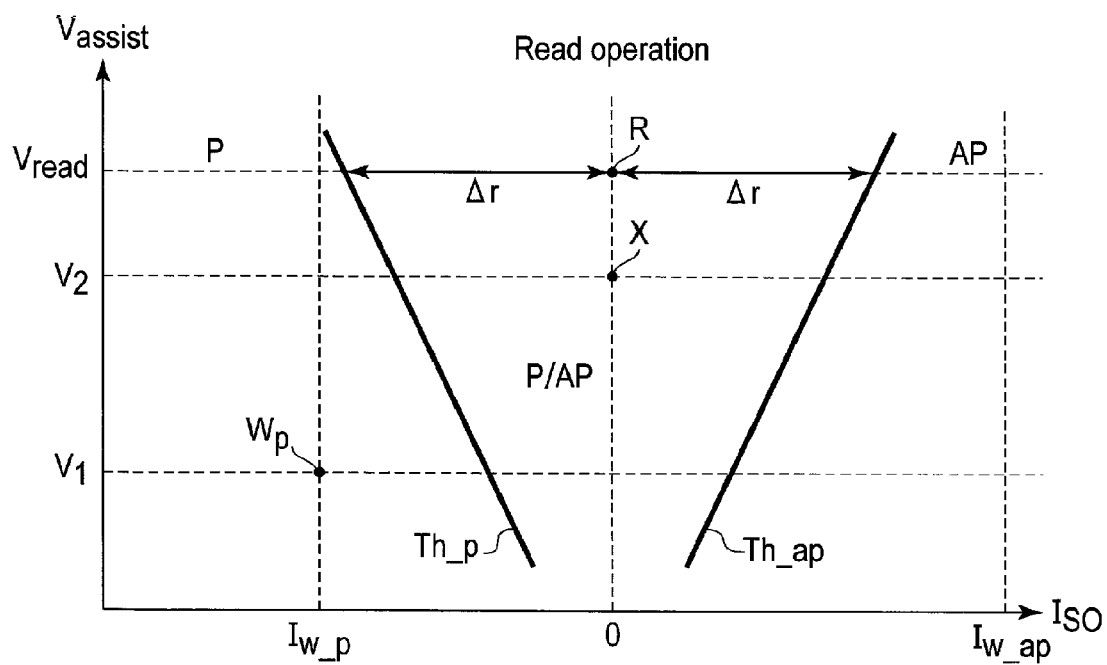
FIG. 9 is a diagram showing a read operation in the first characteristic.

In this case, for example, as shown in FIG. 9, the read potential $V_{read}$ is desirably a potential of polarity that makes reversal of the magnetization direction of the first magnetic layer FL of the storage element MTJ difficult in a read operation. That is, in the first case (FIGS. 5 to 9), a distance Δr between a read point R and the first and second threshold lines Th_p, Th_ap increases in a direction in which $V_{assist}$ is a positive potential and thus, the read potential $V_{read}$ is desirably a positive potential.

Therefore, the second potential (for example, the ground potential $V_{ss}$) $V_2$ becomes a potential between the first potential (for example, a negative potential) $V_1$ and the read potential (for example, a positive potential) $V_{read}$.

However, the read potential $V_{read}$ can be set to between the first potential $V_1$ and the second potential $V_2$.

Also, what can be known from the second case (FIGS. 10 to 14) is that the current $I_{SO}$ needed to reverse the magnetization direction of the first magnetic layer FL can be made smaller by applying a positive potential to the second magnetic layer RL of the storage element MTJ as $V_{assist}$.

Figure 10:
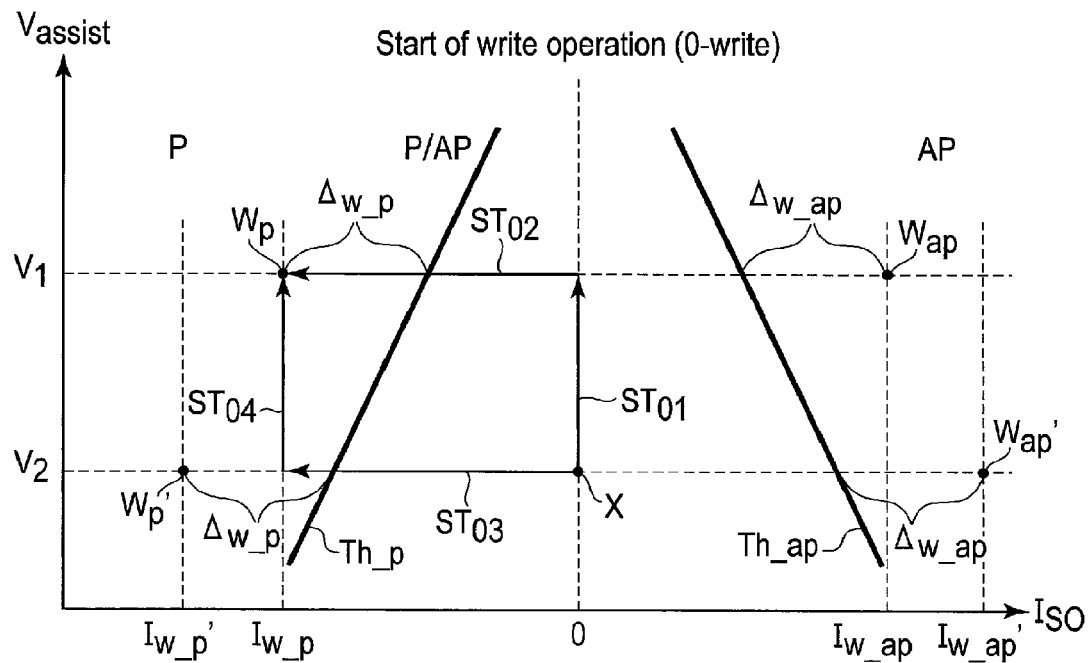
FIG. 10 is a diagram showing the start of the write operation (0-write) in a second characteristic.

When, for example, as shown in FIG. 10, the margins $\Delta_{w\_p}$, $\Delta_{w\_ap}$ from the first and second threshold lines Th_p, Th_ap are secured in consideration of thermal disturbance in a write operation, write currents $I_{w\_p}$, $I_{w\_ap}$ when $V_{assist}$ is a positive potential are smaller than write currents $I_{w\_p}'$, $I_{w\_ap}'$ when $V_{assist}$ is 0V. That is, write points $W_p$, $W_{ap}$ can be set closer to 0 than write points $W_p'$, $W_{ap}'$.

In this case, for example, as shown in FIG. 14, the read potential $V_{read}$ is desirably a potential of polarity that makes reversal of the magnetization direction of the first magnetic layer FL of the storage element MTJ difficult in a read operation. That is, in the second case (FIGS. 10 to 14), the distance Δr between the read point R and the first and second threshold lines Th_p, Th_ap increases in a direction in which $V_{assist}$ is a negative potential and thus, the read potential $V_{read}$ is desirably a negative potential.

Therefore, the second potential (for example, the ground potential $V_{ss}$) $V_2$ becomes a potential between the first potential (for example, a positive potential) $V_1$ and the read potential (for example, a negative potential) $V_{read}$.

However, the read potential $V_{read}$ can be set to between the first potential $V_1$ and the second potential $V_2$.

In the first and second cases (FIGS. 5 to 14), the first or second current $I_{write}$ ($I_{w\_ap}$ or $I_{w\_p}$) flows between the first and second portions $E_1$, $E_2$ in a write operation. That is, while the first or second current $I_{write}$ ($I_{w\_ap}$ or $I_{w\_p}$) flows, the third portion $E_3$ has a predetermined potential (for example, a positive potential).

Therefore, in consideration of the predetermined potential generated in the third portion $E_3$ while the first or second current $I_{write}$ ($I_{w\_ap}$ or $I_{w\_p}$) flows, the first potential $V_1$ is set such that an appropriate assist voltage is applied to the storage element MTJ. That is, in the first case, the first potential $V_1$ may be, instead of a negative potential, 0V or a positive potential. In the second case, the first potential $V_1$ may be, instead of a positive potential, 0V or a negative potential.

A write operation (0-write) in the first case (FIGS. 5 to 9) is started by, as shown in FIG. 5, setting $V_{assist}$ to the first potential $V_1$ and $I_{SO}$ to the write current $I_{w\_p}$. The order thereof may be that, as shown in FIG. 5, $I_{SO}$ is set to the write current $I_{w\_p}$ after $V_{assist}$ is set to the first potential $V_1$ (steps $ST_{01} \to ST_{02}$) or $V_{assist}$ is set to the first potential $V_1$ after $I_{SO}$ is set to the write current $I_{w\_p}$ (steps $ST_{03} \to ST_{04}$).

Figure 6:
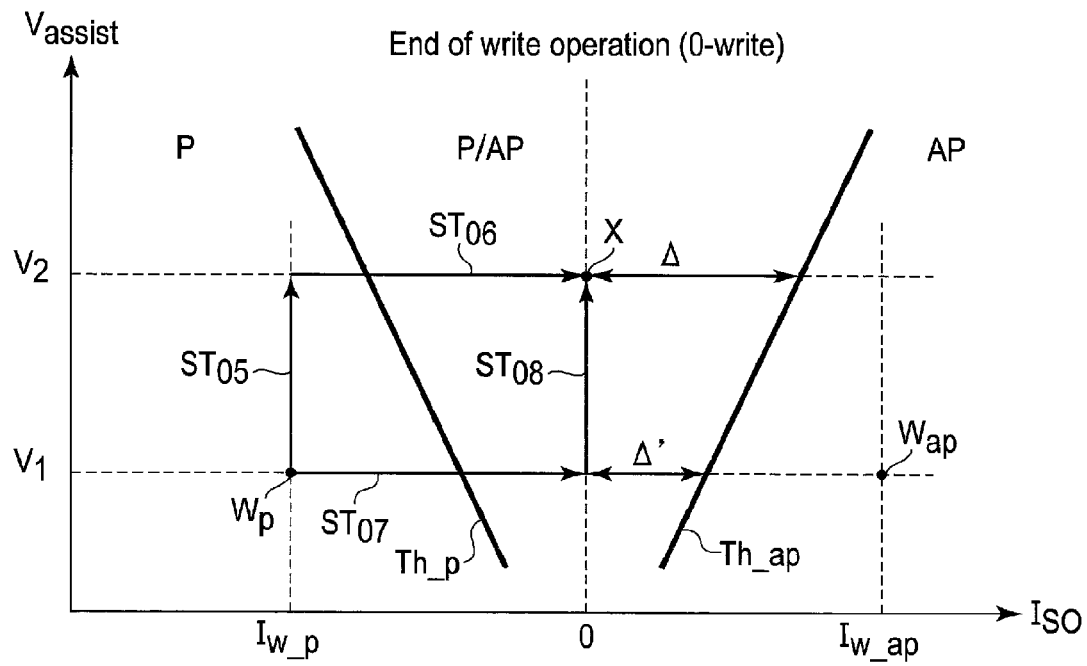
FIG. 6 is a diagram showing the end of the write operation (0-write) in the first characteristic.

The write operation (0-write) in the first case is terminated by setting, as shown in FIG. 6, $V_{assist}$ to the second potential $V_2$ and then $I_{SO}$ to 0 (steps $ST_{05} \to ST_{06}$). This is because, as shown in FIG. 6, by taking the route from step $ST_{05}$ to step $ST_{06}$, the minimum margin between the route and the second threshold line Th_ap becomes Δ.

When, for example, the route from step $ST_{07}$ to step $ST_{08}$ is taken, the minimum margin Δ becomes larger than a minimum margin Δ' between the route and the second threshold line Th_ap. Therefore, when the write operation (0-write) is terminated, a 1-write is not erroneously generated due to thermal disturbance or the like so that a write error rate can be reduced.

It is assumed here that a 0-write means a write operation that puts the storage element MTJ into a parallel state (low-resistance state).

Figure 7:
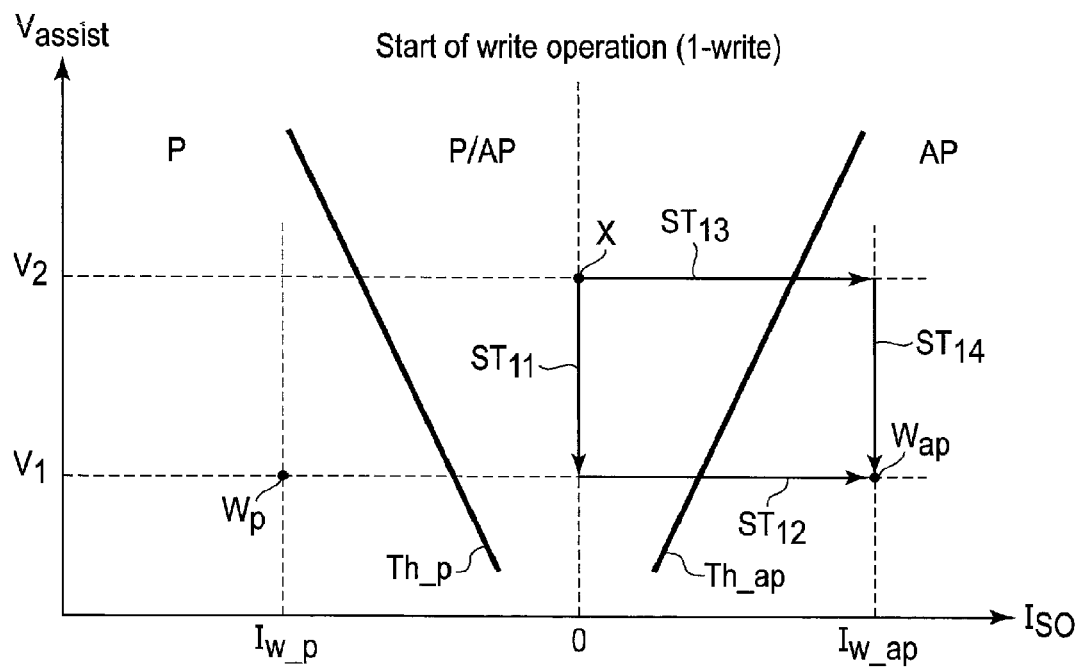
FIG. 7 is a diagram showing the start of a write operation (1-write) in the first characteristic.

A write operation (1-write) in the first case (FIGS. 5 to 9) is started by, as shown in FIG. 7, setting $V_{assist}$ to the first potential $V_1$ and $I_{SO}$ to the write current $I_{w\_ap}$. The order thereof may be that, as shown in FIG. 7, $I_{SO}$ is set to the write current $I_{w\_ap}$ after $V_{assist}$ is set to the first potential $V_1$ (steps $ST_{11} \to ST_{12}$) or $V_{assist}$ is set to the first potential $V_1$ after $I_{SO}$ is set to the write current $I_{w\_ap}$ (steps $ST_{13} \to ST_{14}$).

The write operation (1-write) in the first case is terminated by setting, as shown in FIG. 8, $V_{assist}$ to the second potential $V_2$ and then $I_{SO}$ to 0 (steps $ST_{15} \to ST_{16}$). This is because, as shown in FIG. 8, by taking the route from step $ST_{15}$ to step $ST_{16}$, the minimum margin between the route and the first threshold line Th_p becomes Δ.

When, for example, the route from step $ST_{17}$ to step $ST_{18}$ is taken, the minimum margin Δ becomes larger than a minimum margin Δ' between the route and the first threshold line Th_p. Therefore, when the write operation (1-write) is terminated, a 0-write is not erroneously generated due to thermal disturbance or the like so that a write error rate can be reduced.

It is assumed here that a 1-write means a write operation that puts the storage element MTJ into an antiparallel state (high-resistance state).

A read operation in the first case (FIGS. 5 to 9) is performed by, as shown in FIG. 9, setting $V_{assist}$ to the read potential $V_{read}$. The write current $I_{SO}$ is 0 in the read operation and thus, a 0-write or 1-write is not generated. In the read operation, however, in consideration of thermal disturbance or the like, it is desirable to make a margin Δr between the read point R and the first and second threshold lines Th_p, Th_ap as large as possible.

Therefore, the read point R is desirably set in an opening direction of the first and second threshold lines Th_p, Th_ap, that is, in a direction in which the width of the first and second threshold lines Th_p, Th_ap broadens. In the present example, the read point R is set in a direction in which the read potential $V_{read}$ becomes a positive potential.

A write operation (0-write) in the second case (FIGS. 10 to 14) is started by, as shown in FIG. 10, setting $V_{assist}$ to the first potential $V_1$ and $I_{SO}$ to the write current $I_{w\_p}$. The order thereof may be that, as shown in FIG. 10, $I_{SO}$ is set to the write current $I_{w\_p}$ after $V_{assist}$ is set to the first potential $V_1$ (steps $ST_{21} \to ST_{22}$) or $V_{assist}$ is set to the first potential $V_1$ after $I_{SO}$ is set to the write current $I_{w\_p}$ (steps $ST_{23} \to ST_{24}$).

Figure 11:
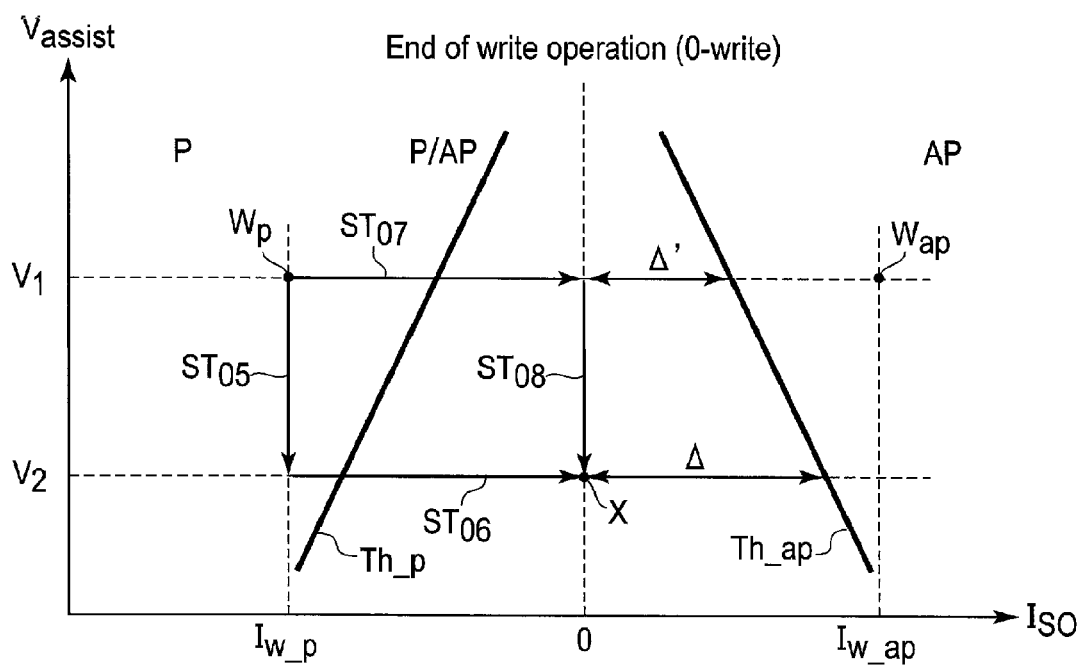
FIG. 11 is a diagram showing the end of the write operation (0-write) in the second characteristic.

The write operation (0-write) in the second case is terminated by setting, as shown in FIG. 11, $V_{assist}$ to the second potential $V_2$ and then $I_{SO}$ to 0 (steps $ST_{25} \to ST_{26}$). This is because, as shown in FIG. 11, by taking the route from step $ST_{25}$ to step $ST_{26}$, the minimum margin between the route and the second threshold line Th_ap becomes Δ.

When, for example, the route from step $ST_{27}$ to step $ST_{28}$ is taken, the minimum margin Δ becomes larger than a minimum margin Δ' between the route and the second threshold line Th_ap. Therefore, when the write operation (0-write) is terminated, a 1-write is not erroneously generated due to thermal disturbance or the like so that a write error rate can be reduced.

Figure 12:
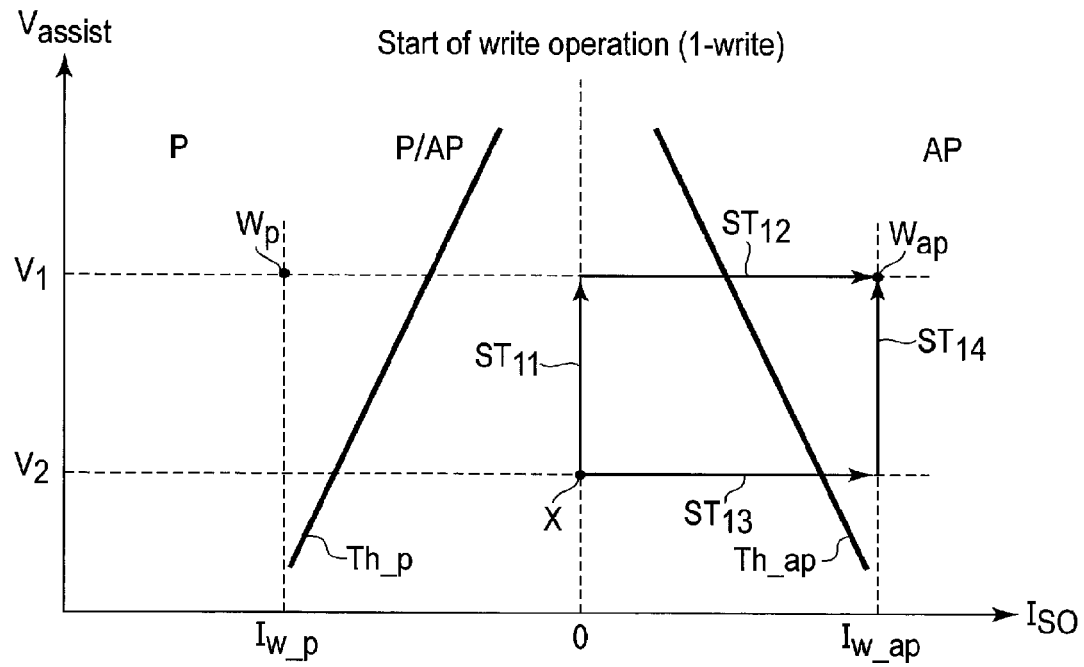
FIG. 12 is a diagram showing the start of the write operation (1-write) in the second characteristic.

A write operation (1-write) in the second case (FIGS. 10 to 14) is started by, as shown in FIG. 12, setting $V_{assist}$ to the first potential $V_1$ and $I_{SO}$ to the write current $I_{w\_ap}$. The order thereof may be that, as shown in FIG. 12, $I_{SO}$ is set to the write current $I_{w\_ap}$ after $V_{assist}$ is set to the first potential $V_1$ (steps $ST_{31} \to ST_{32}$) or $V_{assist}$ is set to the first potential $V_1$ after $I_{SO}$ is set to the write current $I_{w\_ap}$ (steps $ST_{33} \to ST_{34}$).

Figure 13:
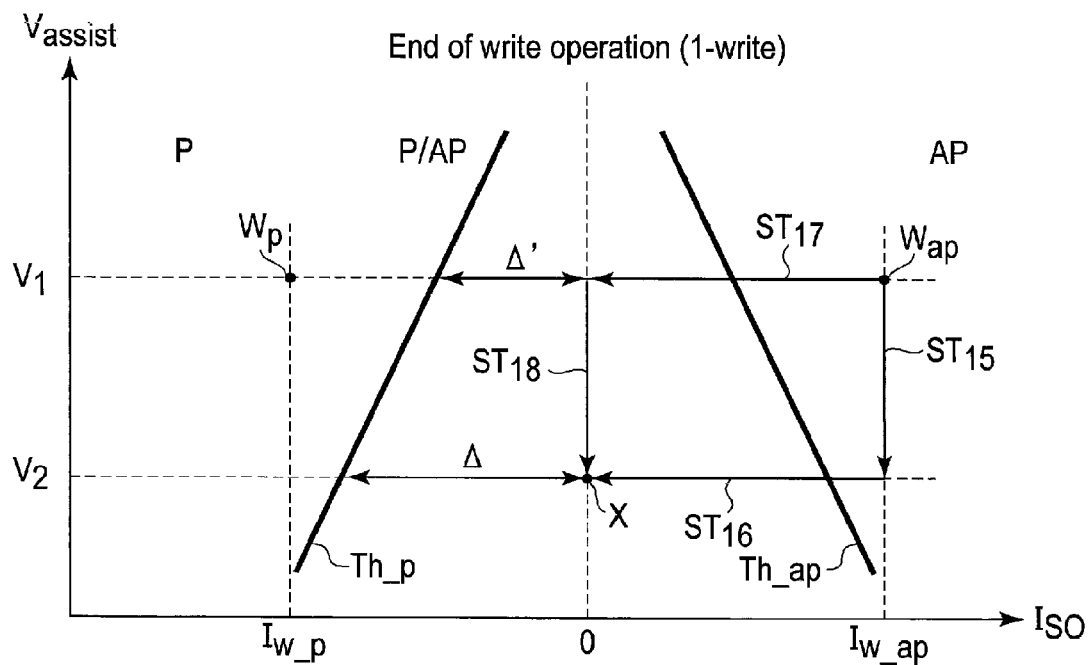
FIG. 13 is a diagram showing the end of the write operation (1-write) in the second characteristic.

The write operation (1-write) in the second case is terminated by setting, as shown in FIG. 13, $V_{assist}$ to the second potential $V_2$ and then $I_{SO}$ to 0 (steps $ST_{35} \to ST_{36}$). This is because, as shown in FIG. 13, by taking the route from step $ST_{35}$ to step $ST_{36}$, the minimum margin between the route and the first threshold line Th_p becomes Δ.

When, for example, the route from step $ST_{37}$ to step $ST_{38}$ is taken, the minimum margin Δ becomes larger than a minimum margin Δ' between the route and the first threshold line Th_p. Therefore, when the write operation (1-write) is terminated, a 0-write is not erroneously generated due to thermal disturbance or the like so that a write error rate can be reduced.

A read operation in the second case (FIGS. 10 to 14) is performed by, as shown in FIG. 14, setting $V_{assist}$ to the read potential $V_{read}$. The write current $I_{SO}$ is 0 in the read operation and thus, a 0-write or 1-write is not generated. In the read operation, however, in consideration of thermal disturbance or the like, it is desirable to make a margin Δr between the read point R and the first and second threshold lines Th_p, Th_ap as large as possible.

Therefore, the read point R is desirably set in an opening direction of the first and second threshold lines Th_p, Th_ap, that is, in a direction in which the width of the first and second threshold lines Th_p, Th_ap broadens. In the present example, the read point R is set in a direction in which the read potential $V_{read}$ becomes a negative potential.

Figure 41A:
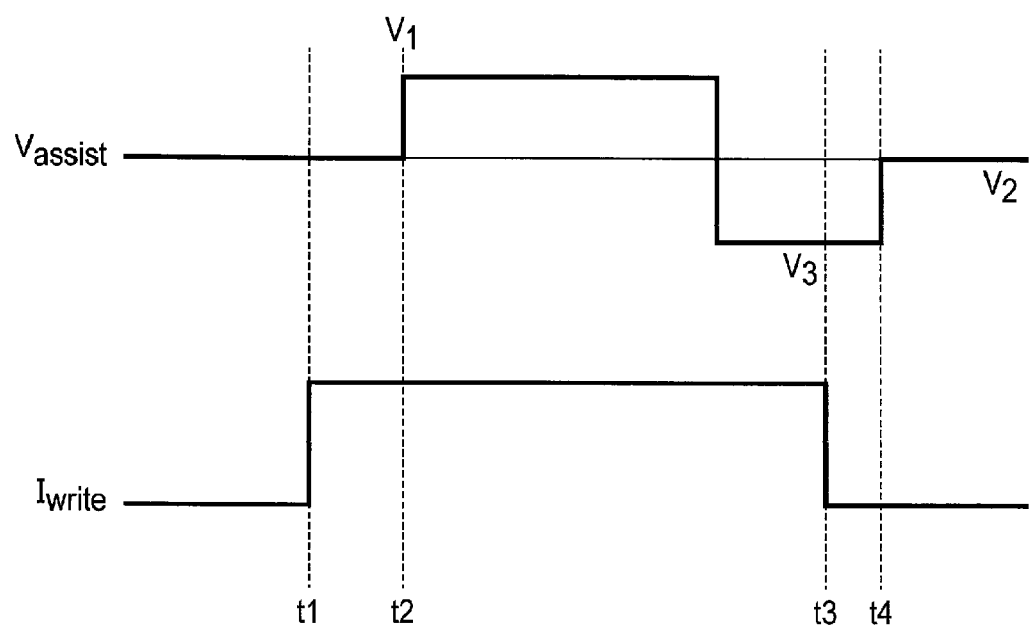
FIGS. 41A and 41B are signal waveform diagrams shown for explaining an example in which a write error rate is reduced.

To further reduce the write error rate, as shown in FIG. 41A, a third potential $V_3$ can be added during writing. At this time, the third potential $V_3$ is a potential of polarity that makes reversal of the magnetization direction of the first magnetic layer FL of the storage element MTJ difficult (for example, a negative potential). Thus, the write error rate can be reduced by increasing the resistance to the thermal agitation in comparison with the standby state and preventing back-hopping.

Figure 41B:
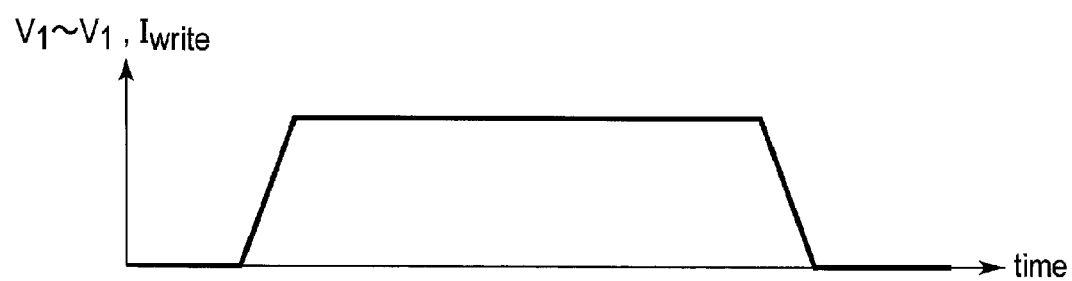

As shown in FIG. 41B, slope may be actively added to each of the voltages $V_1$ to $V_3$ and the write current $I_{write}$. In particular, when the temperature of the write line is increased by the write current $I_{write}$, the error rate can be decreased by writing data with slope.

This modification can be also applied to the following embodiments.

Second Embodiment

FIG. 15 shows a magnetic memory according to a second embodiment.

The magnetic memory is what is called a SOT magnetic memory.

A conductive wire 11 has a first portion $E_1$, a second portion $E_2$, and a third portion $E_3$ therebetween. For example, the first and second portions $E_1$, $E_2$ correspond to two ends of the conductive wire 11 in a direction in which the conductive wire 11 extends and the third portion $E_3$ corresponds to a center portion of the conductive wire 11.

Storage elements $MTJ_1$, $MTJ_2$ are 2-terminal elements having a first terminal and a second terminal.

For example, the storage elements $MTJ_1$, $MTJ_2$ are a magnetoresistive effect element. In this case, the storage elements $MTJ_1$, $MTJ_2$ include a first magnetic layer (first terminal) FL having a variable magnetization direction, a second magnetic layer (second terminal) RL having an invariable magnetization direction, and a nonmagnetic layer (tunnel barrier layer) TN between the first and second magnetic layers FL, RL and the first magnetic layer FL is connected to the third portion $E_3$.

A first circuit 12 can generate one of a first current $I_{w\_ap}$ and a second current $I_{w\_p}$ opposite to each other between the first and second portions $E_1$, $E_2$.

For example, the first circuit 12 includes driver/sinkers D/S_A, D/S_B capable of generating one of the first current $I_{w\_ap}$ and the second current $I_{w\_p}$ between the first and second portions $E_1$, $E_2$ in accordance with write data (0 or 1) and a transfer gate TG.

In this case, when the write data is 1, for example, the driver/sinker D/S_A outputs $V_{dd\_W1}$ (positive potential) and the driver sinker D/S_B outputs a ground potential $V_{ss}$. When a control signal $\varphi_3$ becomes active (1), the transfer gate TG is turned on and a write pulse WP_A is generated. Thus, the first current $I_{write}$ ($=I_{w\_ap}$) flows from the first portion $E_1$ toward the second portion $E_2$.

Also, when the write data is 0, for example, the driver/sinker D/S_B outputs $V_{dd\_W1}$ (positive potential) and the driver sinker D/S_A outputs the ground potential $V_{ss}$. When the control signal $\varphi_3$ becomes active (1), the transfer gate TG is turned on and a write pulse WP_B is generated. Thus, the second current $I_{write}$ ($=I_{w\_p}$) flows from the second portion $E_2$ toward the first portion $E_1$.

In a write operation, second circuits $13_1$, $13_2$ can apply one of a first potential $V_1$, a second potential $V_2$, and a third potential $V_3$ that are difficult from each other to the second magnetic layer (second terminal) RL of the storage elements $MTJ_1$, $MTJ_2$. Also, in a read operation, the second circuits $13_1$, $13_2$ can apply a read potential $V_{read}$ to the second magnetic layer (second terminal) RL of the storage element MTJ.

For example, the second circuits $13_1$, $13_2$ include selectors $14_1$, $14_2$, for example, multiplexers MUX that output one of the first potential $V_1$, the second potential $V_2$, the third potential $V_3$, and the read potential $V_{read}$ based on control signals $\varphi_{11}$, $\varphi_{12}$ respectively. The potential output from the selectors $14_1$, $14_2$ is applied to the second magnetic layer (second terminal) RL of the storage elements $MTJ_1$, $MTJ_2$.

In this case, in a write operation, the selectors $14_1$, $14_2$ select the first potential $V_1$ or the third potential $V_3$ based on the control signals $\varphi_{11}$, $\varphi_{12}$ respectively. The first potential $V_1$ is an assist potential that enables a write operation, for example, a negative potential. The third potential $V_3$ is an inhibit potential that inhibits a write operation, for example, a positive potential. The first and third potentials $V_1$, $V_3$ are different from the potential of the third portion $E_3$ when a first or second current $I_{write}$ ($I_{w\_ap}$ or $I_{w\_p}$) flows between the first and second portions $E_1$, $E_2$.

In a read operation, the selector 14 selects the read potential $V_{read}$. The read potential $V_{read}$ is, for example, a positive potential.

The second potential $V_2$ is a potential selected by the selectors $14_1$, $14_2$ on standby, that is, when none of the write operation and read operation is performed.

A controller 15 controls read operations and write operations.

For example, a case in which the storage element $MTJ_1$ is selected to be written into and the storage element $MTJ_2$ is not selected to be written into in a write operation will be considered.

In this case, a controller 15 transfers the control signal $\varphi_{11}$ to a second circuit $13_1$. The selector $14_1$ applies the second potential $V_2$ to the second magnetic layer RL of the storage element $MTJ_1$ based on the control signal $\varphi_{11}$. Also, the controller 15 transfers the control signal $\varphi_{12}$ to a second circuit $13_2$. The selector $14_2$ applies the third potential $V_3$ to the second magnetic layer RL of the storage element $MTJ_2$ based on the control signal $\varphi_{12}$.

Further, the controller 15 transfers the control signal $\varphi_3$ to the first circuit 12. The first circuit 12 generates the first or second current $I_{write}$ ($I_{w\_ap}$ or $I_{w\_p}$) between the first and second portions $E_1$, $E_2$ based on the control signal $\varphi_3$.

Then, the controller 15 controls the potential of the second magnetic layer RL of the storage elements $MTJ_1$, $MTJ_2$ and the first or second current $I_{write}$ ($I_{w\_ap}$ or $I_{w\_p}$) in the order below.

The controller 15 applies the third potential $V_3$ to the second magnetic layer RL of the storage element $MTJ_2$. Then, the controller 15 passes the first or second current $I_{write}$ ($I_{w\_ap}$ or $I_{w\_p}$) to between the first and second portions $E_1$, $E_2$. Due to this order, data is inhibited from being erroneously written into the storage element $MTJ_2$ not to be written into.

On the other hand, the controller 15 applies the first potential $V_1$ to the second magnetic layer RL of the storage element $MTJ_1$. The timing when the first potential $V_1$ is applied to the second magnetic layer RL of the storage element $MTJ_1$ may be, as described with reference to FIGS. 2 to 4, after the first or second current $I_{write}$ ($I_{w\_ap}$ or $I_{w\_p}$) is passed to between the first and second portions $E_1$, $E_2$ or before the first or second current $I_{write}$ ($I_{w\_ap}$ or $I_{w\_p}$) is passed to between the first and second portions $E_1$, $E_2$.

The timing when the first potential $V_1$ is applied to the second magnetic layer RL of the storage element $MTJ_1$ may be the same as the timing when the first or second current $I_{write}$ ($I_{w\_ap}$ or $I_{w\_p}$) is passed to between the first and second portions $E_1$, $E_2$.

Then, the first or second current $I_{write}$ ($I_{w\_ap}$ or $I_{w\_p}$) flows between the first and second portions $E_1$, $E_2$ and the first potential $V_1$ is applied to the second magnetic layer RL of the storage element $MTJ_1$ to write, for example, first data (1) or second data (0) into the storage element $MTJ_1$.

Next, after the first or second data is written into the storage element $MTJ_1$, the controller 15 changes the potential of the second magnetic layer RL of the storage element $MTJ_1$ from the first potential $V_1$ to the second potential $V_2$. Then, the controller 15 shuts off the first or second current $I_{write}$ ($I_{w\_ap}$ or $I_{w\_p}$) between the first and second portions $E_1$, $E_2$.

That is, the timing to change the potential of the second magnetic layer RL of the storage element $MTJ_1$ as a write target from the first potential $V_1$ to the second potential $V_2$ is before the timing when the first or second current $I_{write}$ ($I_{w\_ap}$ or $I_{w\_p}$) between the first and second portions $E_1$, $E_2$ is shut off. Due to this order, data opposite to write data is prevented from being erroneously stored in the storage element $MTJ_1$ when the write operation is terminated.

Also, after the first or second data is written into the storage element $MTJ_1$, the controller 15 shuts off the first or second current $I_{write}$ ($I_{w\_ap}$ or $I_{w\_p}$) between the first and second portions $E_1$, $E_2$. Then, the controller 15 changes the potential of the second magnetic layer RL of the storage element $MTJ_2$ from the third potential $V_3$ to the second potential $V_2$.

That is, the timing to change the potential of the second magnetic layer RL of the storage element $MTJ_2$ not to be written into from the third potential $V_3$ to the second potential $V_2$ is after the timing when the first or second current $I_{write}$ ($I_{w\_ap}$ or $I_{w\_p}$) between the first and second portions $E_1$, $E_2$ is shut off. Due to this order, write data is prevented from being erroneously written into the storage element $MTJ_2$ when the write operation is terminated.

The read operation is the same as in the first embodiment and thus, the description thereof here is omitted.

Third Embodiment

FIG. 16 shows a magnetic memory according to a third embodiment.

The magnetic memory is SOT-MRAM.

SOT-MRAM 31 includes an interface 32, an internal controller 33, a memory cell array 34, and a word line decoder/driver 35. The memory cell array 34 includes n blocks (memory cores) BK_1 to BK_n. Where n is a natural number equal to 2 or greater.

A command CMD is transferred to the internal controller 33 via the interface 32. The command CMD includes, for example, a read command, a write command and the like.

When the command CMD is received, the internal controller 33 outputs, for example, control signals $WE_1$ to $WE_n$, WE1/2, $W_{sel\_1}$ to $W_{sel\_n}$ to execute the command CMD. The meanings and roles of these control signals will be described below.

An address signal Addr is transferred to the internal controller 33 via the interface 32. The address signal Addr is divided into a row address $A_{row}$ and column addresses $A_{col\_1}$ to $A_{col\_n}$ in the interface 32. The row address $A_{row}$ is transferred to the word line decoder/driver 35. The column addresses $A_{col\_1}$ to $A_{col\_n}$ are transferred to the n blocks BK_1 to BK_n.

$DA_1$ to $DA_n$ are read data or write data transmitted/received in a read operation or write operation.

Each block BK_k includes a sub-array $A_{sub\_k}$, a read/write circuit 36, and a column selector 37.

The column selector 37 selects one of j columns (j is a natural number equal to 2 or greater) $CoL_1$ to $CoL_j$ and electrically connects the selected one column $CoL_p$ (p is one of 1 to j) to the read/write circuit 36.

The sub-array $A_{sub\_k}$ includes, for example, a cell unit $CU_{ij}$. The cell unit $CU_{ij}$ includes memory cells $MC_1$ to $MC_8$ and transistors $Q_S$, $Q_W$. The transistors $Q_S$, $Q_W$ are, for example, N-channel FET (Field effect transistor).

FIGS. 17 to 22 show examples of the cell unit $CU_{ij}$ in FIG. 16.

A conductive wire 11 extends in a first direction. The cell unit $CU_{ij}$ corresponds to the conductive wire 11 and includes a plurality of memory cells $MC_1$ to $MC_8$. The plurality of memory cells $MC_1$ to $MC_8$ includes eight memory cells in the present example, but the present embodiment is not limited to such an example. For example, the plurality of memory cells $MC_1$ to $MC_8$ may include two memory cells or more.

The plurality of memory cells $MC_1$ to $MC_8$ includes storage elements $MTJ_1$ to $MTJ_8$ and transistors $T_1$ to $T_8$ respectively.

The storage elements $MTJ_1$ to $MTJ_8$ are each magnetoresistive effect elements. For example, each of the storage elements $MTJ_1$ to $MTJ_8$ includes a first magnetic layer (storage layer) 22 having a variable magnetization direction, a second magnetic layer (reference layer) 23 having an invariable magnetization direction, and a nonmagnetic layer (tunnel barrier layer) 24 between the first and second magnetic layers 22, 23 and the first magnetic layer 22 is connected to the conductive wire 11.

In this case, the conductive wire 11 desirably has a material and a thickness capable of controlling the magnetization direction of the first magnetic layer of the storage elements $MTJ_1$ to $MTJ_8$ by the spin orbit coupling or Rashba effect. For example, the conductive wire 11 contains a metal such as tantalum (Ta), tungsten (W), or platinum (Pt) and has a thickness of 5 to 20 nm (for example, about 10 nm).

The transistors $T_1$ to $T_8$ are each, for example, N-channel FET (Field effect transistor). The transistors $T_1$ to $T_8$ are desirably what is called vertical transistors arranged on a semiconductor substrate and in which a channel (current path) is in a longitudinal direction in which the channel intersects the surface of the semiconductor substrate.

The storage element $MTJ_d$ (d is one of 1 to 8) has a first terminal (storage layer) and a second terminal (reference layer) and the first terminal is connected to the conductive wire 11. The transistor Td has a third terminal (source/drain), a fourth terminal (source/drain), a channel (current path) between the third and fourth terminals, and a control electrode (gate) that controls the generation of a channel and the third terminal is connected to the second terminal.

The conductive wires $WL_1$ to $WL_8$ extend, for example, in the first direction and are connected to control electrodes of the transistors $T_1$ to $T_8$. Conductive wires $LBL_1$ to $LBL_8$ each extend, for example, in a second direction intersecting the first direction and are connected to the fourth terminal of the transistors $T_1$ to $T_8$.

The transistor $Q_S$ has a channel (current path) connected between the first portion $E_1$ of the conductive wire 11 and a conductive wire SBL and a control terminal (gate) that controls the generation of a channel. The transistor $Q_W$ has a channel (current path) connected between the second portion $E_2$ of the conductive wire 11 and a conductive wire WBL and a control terminal (gate) that controls the generation of a channel.

A conductive wire SWL extends, for example, in the first direction and is connected to control electrodes of the transistors $Q_S$, $Q_W$. The conductive wires SBL, WBL each extend, for example, in the second direction.

In the present example, the transistor $Q_S$ is connected to the first portion $E_1$ of the conductive wire 11 and the transistor $Q_W$ is connected to the second portion $E_2$ of the conductive wire 11, but one of these transistors may be omitted.

In the example of FIG. 17, the conductive wire 11 is arranged in an upper portion of a semiconductor substrate 41 and the transistors $Q_S$, $Q_W$ are arranged in a surface area of the semiconductor substrate 41 as what is called horizontal transistor (FET). Here, the horizontal transistor is a transistor in which a channel (current path) is in a direction along the surface of the semiconductor substrate 41.

The storage elements $MTJ_1$ to $MTJ_8$ are arranged on the conductive wire 11 and the transistors $T_1$ to $T_8$ are arranged on the storage elements $MTJ_1$ to $MTJ_8$. The transistors $T_1$ to $T_8$ are what is called vertical transistors. Also, the conductive wires $LBL_1$ to $LBL_8$, $SBL_j$, $WBL_j$ are arranged on the transistors $T_1$ to $T_8$.

Figure 18:
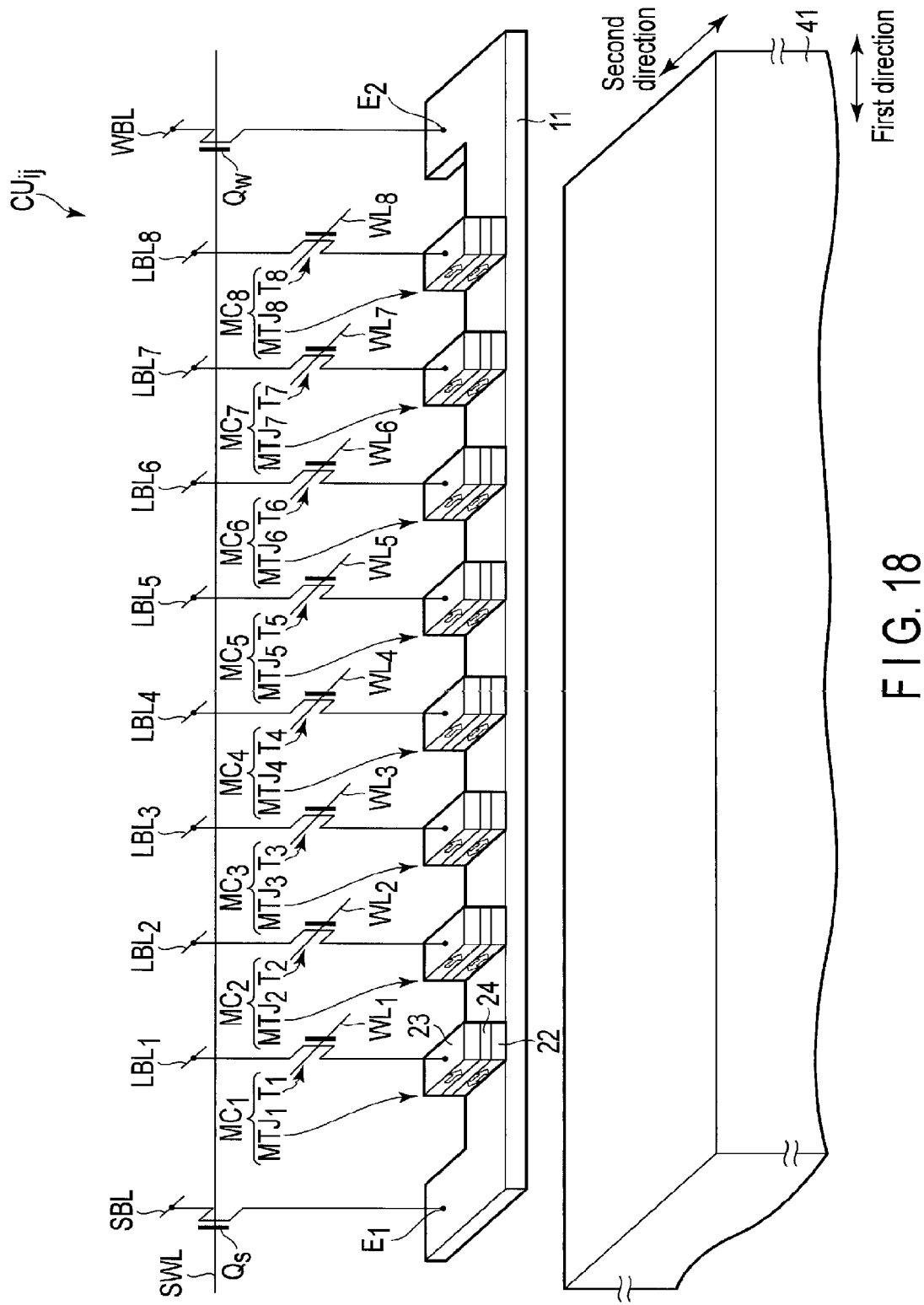
FIG. 18 is a diagram showing an example of the device structure of the unit cell.

In the example of FIG. 18, the conductive wire 11 is arranged in the upper portion of the semiconductor substrate 41 and the transistors $Q_S$, $Q_W$ and the storage elements $MTJ_1$ to $MTJ_8$ are arranged on the conductive wire 11. The transistors $T_1$ to $T_8$ are arranged on the storage elements $MTJ_1$ to $MTJ_8$. The transistors $Q_S$, $Q_W$ and the transistors $T_1$ to $T_8$ are what is called vertical transistors.

The conductive wires $LBL_1$ to $LBL_8$ are arranged on the transistors $T_1$ to $T_8$ and the conductive wires $SBL_j$, $WBL_j$ are arranged on the transistors $Q_S$, $Q_W$.

In the example of FIG. 19, the conductive wires $LBL_1$ to $LBL_8$, $SBL_j$, $WBL_j$ are arranged in the upper portion of the semiconductor substrate 41. The transistors $T_1$ to $T_8$ are arranged on the conductive wires $LBL_1$ to $LBL_8$ and the transistors $Q_S$, $Q_W$ are arranged on the conductive wires $SBL_j$, $WBL_j$. The storage elements $MTJ_1$ to $MTJ_8$ are arranged on the transistors $T_1$ to $T_8$.

Also, the conductive wire 11 is arranged on the transistors $T_1$ to $T_8$ and the transistors $Q_S$, $Q_W$. The transistors $Q_S$, $Q_W$ and the transistors $T_1$ to $T_8$ are what is called vertical transistors.

In the examples of FIGS. 17 to 19, the first and second magnetic layers 22, 23 have an easy-axis of magnetization in an in-plane direction along the surface of the semiconductor substrate 41 and in the second direction intersecting the first direction in which the conductive wire 11 extends.

For example, FIG. 20 shows an example of the device structure of a memory cell $MC_1$ in FIGS. 17 and 19. In this example, the transistor $T_1$ includes a semiconductor pillar (for example, a silicon pillar) 25 extending in a third direction intersecting the first and second directions, that is, in a direction intersecting the surface of the semiconductor substrate 41, a gate insulating layer (for example, silicon oxide) 26 covering a side surface of the semiconductor pillar 25, and a conductive wire $WL_j$ covering the semiconductor pillar 25 and the gate insulating layer 26.

In the example of FIG. 20, the easy-axis of magnetization of the first and second magnetic layers 22, 23 is the second direction, but may be, as shown in the example of FIG. 21, the first direction or, as shown in FIG. 22, the third direction. The storage element $MTJ_1$ in FIGS. 20 and 21 is called an in-plane magnetization magnetoresistive effect element and the storage element $MTJ_1$ in FIG. 22 is called a perpendicular magnetization magnetoresistive effect element.

Incidentally, the memory cell $MC_1$ in FIG. 19 is obtained by turning the device structure in FIGS. 20 to 22 upside down.

The memory cell $MC_1$ in FIGS. 20 to 22 is characterized in that, as described above, the current path of the read current $I_{read}$ used for read operation and the current path of the write current $I_{write}$ used for write operation are different.

For example, the read current $I_{read}$ in a read operation flows from the conductive wire $LBL_1$ toward the conductive wire 11 or from the conductive wire 11 toward the conductive wire $LBL_1$. In a write operation, by contrast, the write current $I_{write}$ flows from right to left or from left to right inside the conductive wire 11.

If the current path of the read current $I_{read}$ used for read operation and the current path of the write current $I_{write}$ used for write operation are the same, sufficient margins have to be secured for the read current $I_{read}$ and the write current $I_{write}$ in consideration thermal stability to prevent a write phenomenon in a read operation from occurring.

However, the read current $I_{read}$ and the write current $I_{write}$ have both become sufficiently small due to increasingly finer structures of memory cells and the like, making it difficult to secure sufficient margins for both.

According to SOT-MRAM in the present example, the current path of the read current $I_{read}$ and the current path of the write current $I_{write}$ are different and thus, sufficient margins can be secured for both in consideration thermal stability even if the read current $I_{read}$ and the write current $I_{write}$ are both small due to increasingly finer structures of memory cells and the like.

Also, when, as described in the first and second embodiments (FIGS. 1 to 15), a 0/1 write is terminated in a write operation, a write error rate can be reduced by bringing the assist potential $V_{assist}$ from the first potential $V_1$ back to the second potential (initial state) $V_2$ and then shutting off the write current $I_{write}$.

FIG. 23 is a diagram showing an example of the read/write circuit in FIG. 16.

The read/write circuit 36 performs a read operation or write operation in a read operation or write operation based on an instruction from the internal controller 33 in FIG. 15.

The read/write circuit 36 includes a read circuit and a write circuit.

Here, however, only the write circuit of the read/write circuit 36 will be described to simplify the description. This is because, like in the first and second embodiments, the third embodiment is characterized by the write operation to reduce the write error rate.

The write circuit includes ROM 45, 47, selectors (multiplexers) 46, 49, $51_1$ to $51_8$, write drivers/sinkers D/S_A, D/S_B, a transfer gate TG, a data register 48, voltage assist drivers $50_1$ to $50_8$, a delay circuit D, and select transistors (for example, N channel FET) $T_S$, $T_U$.

The write drivers/sinkers D/S_A, D/S_B have the function of generating one of a first current $I_{w\_ap}$ and a second current $I_{w\_p}$, which are opposite to each other, in, for example, the conductive wire 11 in FIGS. 17 to 19.

Here, the first current $I_{w\_ap}$ is a current to write 1 to, for example, the storage elements $MTJ_1$ to $MTJ_8$ in FIGS. 17 to 19 by the spin orbit coupling or Rashba effect, that is, a current to set the relation of magnetization directions of the first and second magnetic layers 22, 23 of the storage elements $MTJ_1$ to $MTJ_8$ in FIGS. 17 to 19 to an antiparallel state.

The second current $I_{w\_p}$ is a current to write 0 to, for example, the storage elements $MTJ_1$ to $MTJ_8$ in FIGS. 17 to 19 by the spin orbit coupling or Rashba effect, that is, a current to set the relation of magnetization directions of the first and second magnetic layers 22, 23 of the storage elements $MTJ_1$ to $MTJ_8$ in FIGS. 17 to 19 to a parallel state.

The first current $I_{w\_ap}$ and the second current $I_{w\_p}$ here correspond to the first current $I_{w\_ap}$ and the second current $I_{w\_p}$ in the first and second embodiments (FIGS. 1 to 15).

The voltage assist drivers $50_1$ to $50_8$ have the function of permitting/inhibiting a write operation using the first current $I_{w\_ap}$ and the second current $I_{w\_p}$.

When, for example, a write operation is permitted, the voltage assist drivers $50_1$ to $50_8$ selectively apply the first potential $V_1$ that makes it easier to perform a write operation as the assist potential $V_{assist}$ to, for example, the conductive wires $LBL_1$ to $LBL_8$ in FIGS. 17 to 19. In this case, an assist voltage that destabilizes the magnetization direction of the first magnetic layer (storage layer) 22 in FIGS. 17 to 19 is generated in the storage elements $MTJ_1$ to $MTJ_8$, which makes it easier for the magnetization direction of the first magnetic layer 22 to reverse.

When a write operation is inhibited, the voltage assist drivers $50_1$ to $50_8$ selectively apply the third potential $V_3$ that makes it more difficult to perform a write operation as an inhibit potential $V_{inhibit}$ to, for example, the conductive wires $LBL_1$ to $LBL_8$ in FIGS. 17 to 19. In this case, an assist voltage that destabilizes the magnetization direction of the first magnetic layer (storage layer) 22 in FIGS. 17 to 19 is not generated in the storage elements $MTJ_1$ to $MTJ_8$ or an inhibit voltage that stabilizes the magnetization direction of the first magnetic layer 22 is generated in the storage elements $MTJ_1$ to $MTJ_8$, which makes it more difficult for the magnetization direction of the first magnetic layer 22 to reverse.

When a write operation is inhibited, instead of applying the inhibit potential $V_{inhibit}$ to the conductive wires $LBL_1$ to $LBL_8$, the voltage assist drivers $50_1$ to $50_8$ may put the conductive wires $LBL_1$ to $LBL_8$ into an electrically floating state.

Next, an example of the write operation will be described.

Write Operation

When, for example, a write command CMD is received, the internal controller 33 in FIG. 16 controls a write operation. The internal controller 33 performs a write operation by a first write operation and a second write operation.

The first write operation is an operation to write the same data (for example, 1) into multiple bits (for example, eight bits) as write targets.

First, conductive wires $WL_1$ to $WL_8$, SWL are activated by the word line decoder/driver 35 in FIG. 16.

Next, the internal controller 33 in FIG. 16 sets, for example, a control signal WE1/2 to 0. The control signal WE1/2 is a signal to select one of the first write operation and the second write operation and when, for example, the control signal WE1/2 is 0, the first write operation is selected.

In this case, the selector 46 in the read/write circuit 36 in FIG. 23 selects 1 from the ROM 45 and outputs 1 as ROM data (1). Therefore, the driver/sinker D/S_A outputs, for example, a drive potential $V_{dd\_W1}$ as a write pulse signal and the driver sinker D/S_B outputs, for example, the ground potential $V_{ss}$.

In a write operation, the control signal $\varphi_3$ is activated (high level) and so the transfer gate TG is ON.

Therefore, the write pulse signal is applied to the conductive wire SBL via the transfer gate TG and the ground potential $V_{ss}$ is applied to the conductive wire WBL via the transfer gate TG. At this point, for example, as shown in FIG. 24, the write current (first write current) $I_{write}$ flows from the conductive wire $SBL_j$ toward the conductive wire $WBL_j$, that is, from left to right inside the conductive wire 11.

In the read/write circuit 36 in FIG. 23, the selector 49 selects data stored in the ROM 47 and outputs the data as ROM data (11111111).

Therefore, all of a plurality of the voltage assist drivers $50_1$ to $50_8$ output, for example, the assist voltage $V_1$ to a plurality of the conductive wires $LBL_1$ to $LBL_8$.

Figure 24:
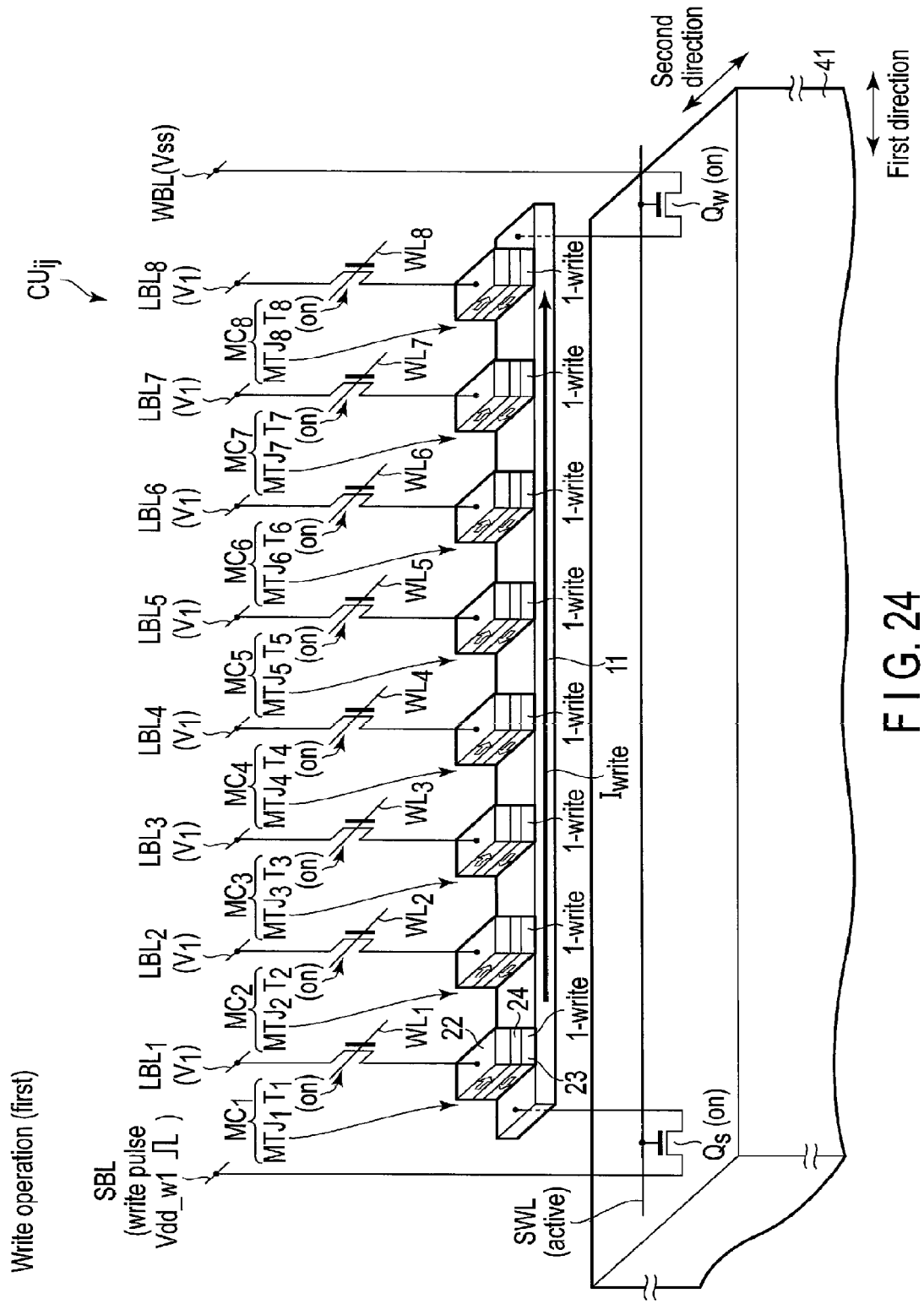
FIG. 24 is a diagram showing an example of a write operation (first)

That is, for example, as shown in FIG. 24, the write current (first write current) $I_{write}$ flows from the conductive wire SBL toward the conductive wire WBL in a state in which the assist potential $V_1$ is applied to all of the plurality of conductive wires $LBL_1$ to $LBL_8$.

As a result, in the first write operation, the same data is written into all of the multiple bits (for example, eight bits) as write targets. It is assumed here that 1 is written in the first write, that is, all of the plurality of storage elements $MTJ_1$ to $MTJ_8$ are put into an antiparallel state.

The second write operation is an operation to hold (for example, if the write data is 1) or change from 1 to 0 (for example, if the write data is 0) the same data (for example, 1) written into the multiple bits (for example, eight bits) as write targets in accordance with the writ data.

First, the conductive wires $WL_1$ to $WL_8$, SWL are held in an activated state by the word line decoder/driver 35 in FIG. 16.

Next, the internal controller 33 in FIG. 16 sets, for example, the control signal WE1/2 to 1. When, for example, the control signal WE1/2 is 1, the second write operation is selected.

In this case, the selector 46 in the read/write circuit 36 in FIG. 23 selects 0 from the ROM 45 and outputs 0 as ROM data (0). Therefore, the driver/sinker D/S_B outputs, for example, the drive potential $V_{dd\_W1}$ as a write pulse signal and the driver sinker D/S_A outputs, for example, the ground potential $V_{ss}$.

The write pulse signal is applied to the conductive wire WBL via the transfer gate TG and the ground potential $V_{ss}$ is applied to the conductive wire SBL via the transfer gate TG. At this point, for example, as shown in FIG. 25, the write current (second write current) $I_{write}$ flows from the conductive wire WBL toward the conductive wire SBL, that is, from right to left inside the conductive wire 11.

In the read/write circuit 36 in FIG. 23, the selector 49 selects write data (for example, 01011100) stored in the data register 48 and outputs an inverted signal (for example, 10100011) of the write data. The write data is stored in advance in the data register 48 before the second write operation is performed.

Therefore, each of the plurality of voltage assist drivers $50_1$ to $50_8$ outputs the first potential $V_1$ as the assist potential $V_{assist}$ when, for example, the inverted signal of write data is 1 and outputs the third potential $V_3$ as the inhibit potential $V_{inhibit}$ when the inverted signal of write data is 0.

Figure 25:
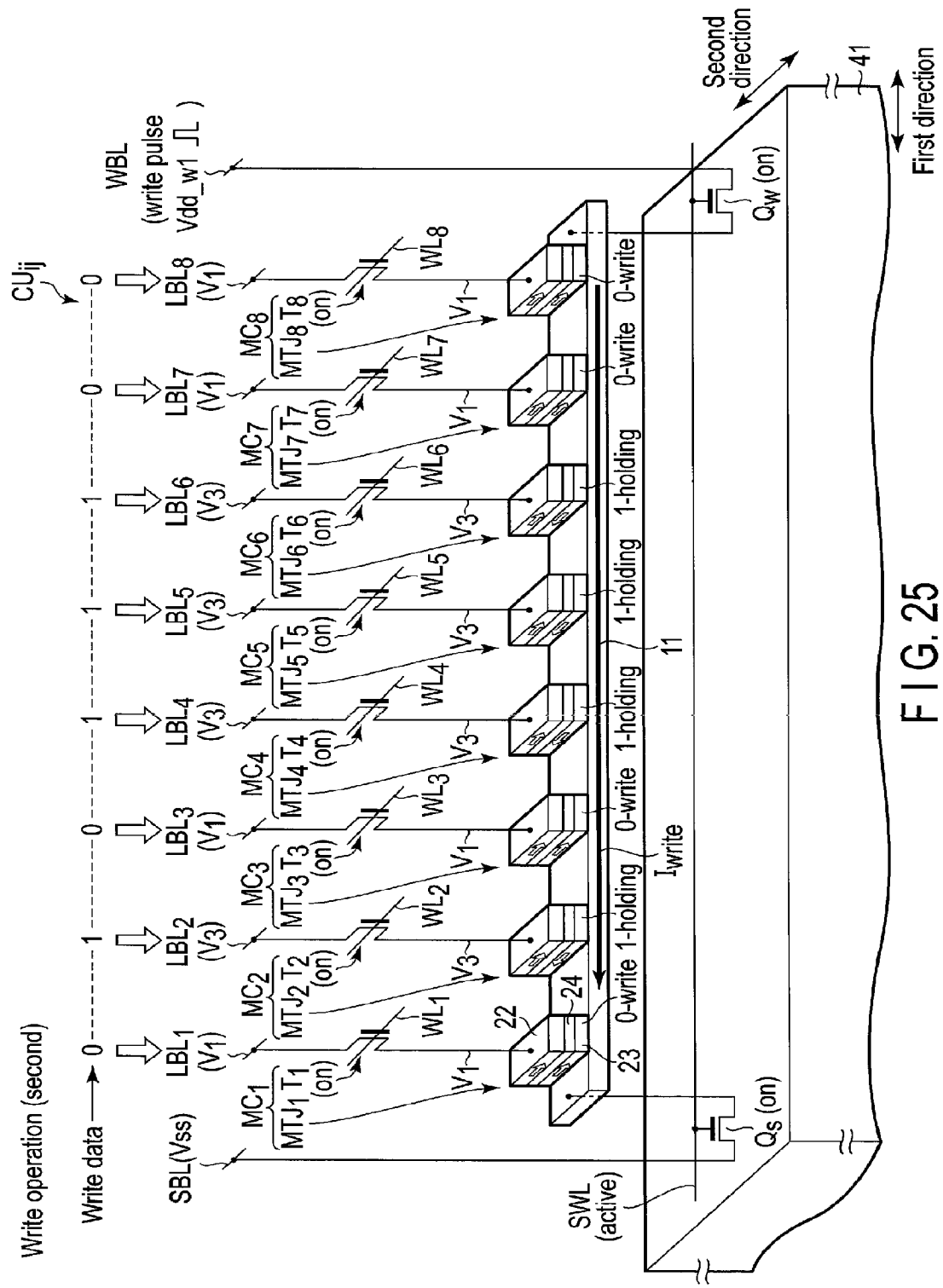
FIG. 25 is a diagram showing an example of a write operation (second)

That is, when, for example, as shown in FIG. 25, the inverted signal of write data is 10100011, the write current (second write current) $I_{write}$ flows from the conductive wire $WBL_j$ toward the conductive wire $SBL_j$ in a state in which the first potential $V_1$ is applied to the conductive wires $LBL_1$, $LBL_3$, $LBL_7$, $LBL_8$ and the third potential $V_3$ is applied to the conductive wires $LBL_2$, $LBL_4$, $LBL_5$, $LBL_6$.

As a result, in the second write operation, data of the storage elements $MTJ_1$, $MTJ_3$, $MTJ_7$, $MTJ_8$ of multiple bits (for example, eight bits) as write targets is changed from 1 to 0, that is, 0 is written thereinto. Also, data of the storage elements $MTJ_2$, $MTJ_4$, $MTJ_5$, $MTJ_6$ of multiple bits (for example, eight bits) as write targets holds 1, that is, 1 is written thereinto.

It is assumed here that in the second write operation, 0 is selectively written into the plurality of storage elements $MTJ_1$ to $MTJ_8$, that is, the plurality of storage elements $MTJ_1$ to $MTJ_8$ is selectively changed from the antiparallel state to the parallel state.

FIG. 26 shows a waveform chart of main signals in the above write operation.

What can be known from the waveform chart is that 1 is written into all the multiple bits (eight bits) in the write operation (first). At this point, the voltage assist is shut off and then the write current $I_{write}$ is shut off at the end of the write operation. This is intended, as described above, to prevent a 0-write from erroneously occurring in the 1-write.

Also, in the write operation (second), 0 is selectively written into the multiple bits (eight bits). At this point, the voltage assist is shut off and then the write current $I_{write}$ is shut off from the selected bit intended for 0-write at the end of the write operation. Accordingly, a 1-write is prevented from erroneously occurring in the 0-write.

For non-selected bits not intended for the 0-write, the voltage assist is applied and then the write current $I_{write}$ is generated at the start of the write operation. Also, the write current $I_{write}$ is shut off and then the voltage assist is shut off at the end of the write operation. Accordingly, a 0-write does not erroneously occur in the 0-write and 1 written in the write operation (first) can be held unchanged.

The relation (order of the application/shutoff) of the voltage assist and the write current $I_{write}$ at the start/end of a write operation in the 0-write of a non-selected bit will be described in detail in fourth and fifth embodiments including the reason therefor.

Therefore, the timing of the application/shutoff of the voltage assist and the write current $I_{write}$ is different between a selected bit and a non-selected bit. The control signal $\varphi_1$, the delay circuit D, the transistors $T_S$, $T_U$, and the selectors $51_1$ to $51_8$ in FIG. 23 are elements to implement the timing in FIG. 26.

In FIG. 23, for example, in the write operation (first), the selectors $51_1$ to $51_8$ select S (select) through control signals $\varphi_{21}$ to $\varphi_{28}$. In this case, the point at which the assist potential $V_{assist}$ changes from $V_1$ to $V_2$ is before the point at which the write current $I_{write}$ is shut off.

In the write operation (second), the selectors $51_1$ to $51_8$ selectively select S (select) or U (unselect) through the control signals $\varphi_{21}$ to $\varphi_{28}$. For example, the selectors $51_1$ to $51_8$ corresponding to selected bits intended for 0-write select S (select). Also, the selectors $51_1$ to $51_8$ corresponding to non-selected bits not intended for 0-write select U (unselect).

In this case, for a selected bit, like in the write operation (first), the point at which the assist potential $V_{assist}$ changes from $V_1$ to $V_2$ is before the point at which the write current $I_{write}$ is shut off.

For a non-selected bit, the point at which the assist potential $V_{assist}$ changes from $V_2$ to $V_1$ is before the point at which the write current $I_{write}$ is applied at the start of a write operation. Also for a non-selected bit, the point at which the assist potential $V_{assist}$ changes from $V_1$ to $V_2$ is after the point at which the write current $I_{write}$ is shut off at the end of a write operation.

Fourth Embodiment

FIG. 27 shows characteristics of a magnetic memory according to a fourth embodiment.

For example, as shown in the upper diagram of FIG. 27, magnetization reversal characteristics of a magnetic memory in consideration of the SOT effect and voltage assist effect exhibit a state in which first and second threshold lines Th_p, Th_ap are open upward. Also, in general, the first and second threshold lines Th_p, Th_ap are bilaterally symmetric with respect to $I_{SO}=0$.

However, if an assist potential $V_{assist}$ is applied to a second magnetic layer RL of a storage element, a flow of electrons in a vertical direction, that is, in a direction in which the first and second magnetic layers FL, RL are stacked arises, in the first storage layer FL, which causes the STT effect.

For example, if the assist potential $V_{assist}$ becomes increasingly higher than the potential of a third portion $E_3$ of a conductive wire 11, that is, with an increasing assist potential $V_{assist}$, the STT effect by electrons flowing from the first storage layer FL toward the second storage layer RL becomes conspicuous. In this case, electrons having a spin in a direction opposite to the magnetization direction of the second magnetic layer RL generate spin torque in the first storage layer FL and thus, the magnetization directions of the first and second storage layers FL, RL are more likely to be in an antiparallel state.

Therefore, as shown in the middle diagram of FIG. 27, magnetization reversal characteristics of the magnetic memory in consideration of the STT effect shift the first and second threshold lines Th_p, Th_ap to the left, that is, an antiparallel state is more likely to be entered and a parallel state is less likely to be entered with an increasing potential $V_{STT}$ applied to the second magnetic layer RL.

Similarly, if the assist potential $V_{assist}$ becomes increasingly lower than the potential of the third portion $E_3$ of the conductive wire 11, that is, with a decreasing assist potential $V_{assist}$, the STT effect by electrons flowing from the second storage layer RL toward the first storage layer FL becomes conspicuous. In this case, electrons having a spin in the same direction as the magnetization direction of the second magnetic layer RL generate spin torque in the first storage layer FL and thus, the magnetization directions of the first and second storage layers FL, RL are more likely to be in a parallel state.

Therefore, as shown in the middle diagram of FIG. 27, magnetization reversal characteristics of the magnetic memory in consideration of the STT effect shift the first and second threshold lines Th_p, Th_ap to the right, that is, a parallel state is more likely to be entered and an antiparallel state is less likely to be entered with a decreasing potential $V_{STT}$ applied to the second magnetic layer RL.

From the above, as shown in the lower diagram of FIG. 27, magnetization reversal characteristics of the magnetic memory in consideration of the SOT effect, the voltage assist effect, and the STT effect decrease the inclination of the first threshold line Th_p indicating whether to enter a parallel state in a graph of $I_{SO}$ (x axis)–$V_{assist}$ (y axis) and increases the inclination of the second threshold line Th_ap indicating whether to enter an antiparallel state.

This means that with increasing $V_{assist}$, the first and second magnetic layers FL, RL are less likely to enter a parallel state. That is, it becomes easier to switch selected bits and non-selected bits in a 0-write (write operation to put a storage element into a parallel state) using the inclination of the first threshold line Th_p. On the other hand, it becomes more difficult to switch selected bits and non-selected bits in a 1-write (write operation to put a storage element into an antiparallel state).

Therefore, for example, in the write operation described in the third embodiment, it is desirable to write 1 into all of multiple bits (eight bits) by setting the 1-write as the write operation (first). Also, by setting the 0-write as the write operation (second), 0 can be selectively written into multiple bits (eight bits) using the inclination of the first threshold line Th_p in FIG. 27.

As a result, the write error rate is further reduced in a write operation of the third embodiment. To make the STT effect more conspicuous and improve bit selectivity (make the inclination of the first threshold line Th_p still smaller), for example, techniques of reducing a resistance-area product (RA) of the storage element MTJ or increasing the spin polarization rate of the first and second magnetic layers FL, RL may be combined.

Regarding the STT effect, in contrast to the above description, a parallel state may also be likely to be entered when electrons flow from the first magnetic layer FL toward the second magnetic layer RL and an antiparallel state may also be likely to be entered when electrons flow from the second magnetic layer RL toward the first magnetic layer FL.

In such a case, the middle diagram of the FIG. 27 changes to characteristics in which a parallel state is more likely to be entered with increasing $V_{STT}$ and an antiparallel state is more likely to be entered with decreasing $V_{STT}$. As a result, the lower diagram of FIG. 27 changes to characteristics in which the inclination of the first threshold line Th_p increases and the inclination of the second threshold line Th_ap decreases.

Therefore, in such a case, the 0-write may be set as the write operation (first) and the 1-write may be set as the write operation (second).

Which trend of the above two cases the STT effect exhibits depends on, for example, band filling of the magnetic material used for the first magnetic layer FL to the 3d orbit.

Next, examples of the write operation will be described.

[First Write Operation (all Bits: 1-Write)]

In the first write operation, a 1-write is performed for multiple bits (all bits).

Figure 28:
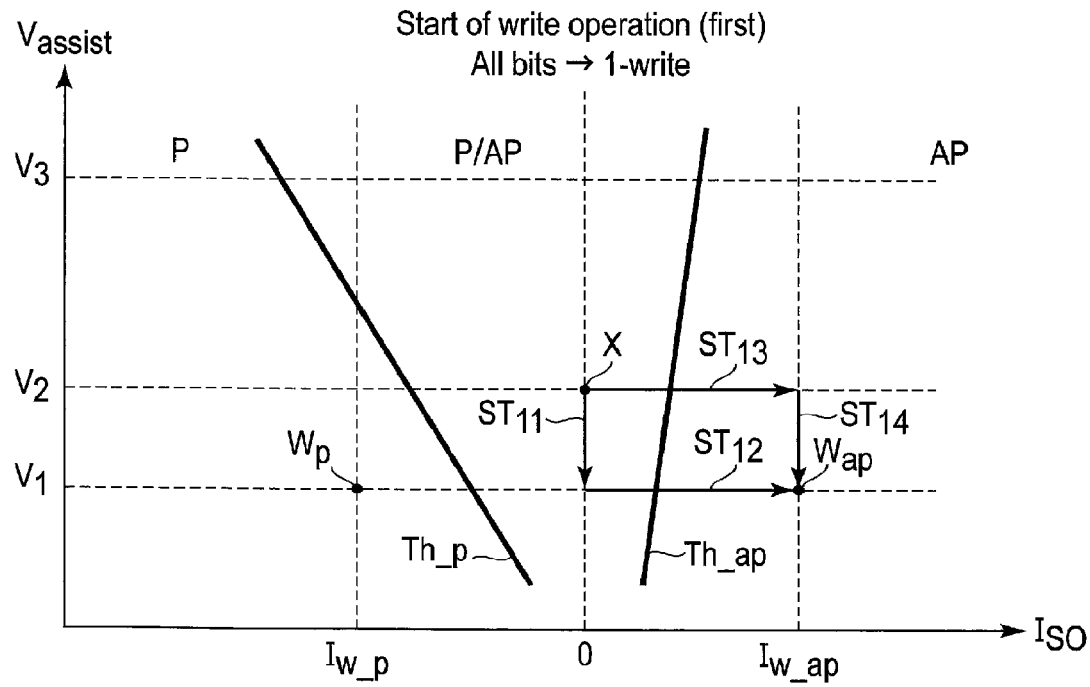
FIG. 28 is a diagram showing the start of the write operation (first)

A write operation (1-write) is started by, as shown in FIG. 28, setting $V_{assist}$ to the first potential $V_1$ and $I_{SO}$ to the write current $I_{w\_ap}$. The order thereof may be that, as shown in FIG. 28, $I_{SO}$ is set to the write current $I_{w\_ap}$ after $V_{assist}$ is set to the first potential $V_1$ (steps $ST_{11} \rightarrow ST_{12}$) or $V_{assist}$ is set to the first potential $V_1$ after $I_{SO}$ is set to the write current $I_{w\_ap}$ (steps $ST_{13} \rightarrow ST_{14}$).

Figure 29:
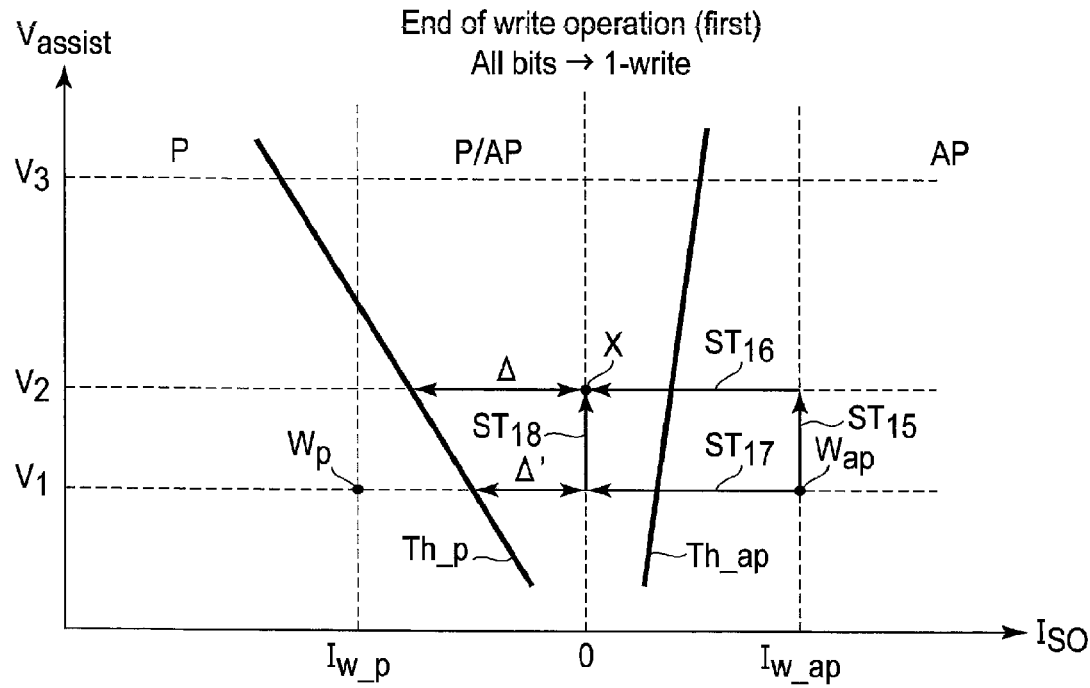
FIG. 29 is a diagram showing the end of the write operation (first)

The write operation (1-write) is terminated by setting, as shown in FIG. 29, $V_{assist}$ to the second potential $V_2$ and then $I_{SO}$ to 0 (steps $ST_{15} \rightarrow ST_{16}$). This is because, as shown in FIG. 8, by taking the route from step $ST_{15}$ to step $ST_{16}$, the minimum margin between the route and the first threshold line Th_p becomes $\Delta$.

When, for example, the route from step $ST_{17}$ to step $ST_{18}$ is taken, the minimum margin $\Delta$ becomes larger than a minimum margin $\Delta'$ between the route and the first threshold line Th_p. Therefore, when the write operation (1-write) is terminated, a 0-write is not erroneously generated due to thermal disturbance or the like so that a write error rate can be reduced.

[Second Write Operation: Selected Bit]

Figure 30:
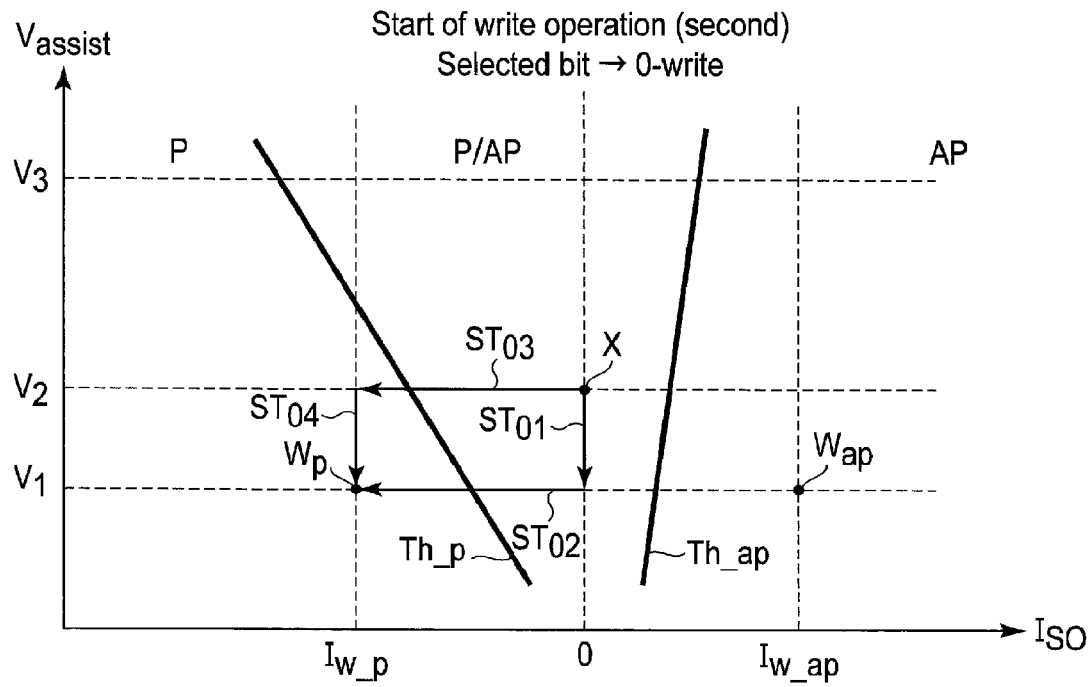
FIG. 30 is a diagram showing the start of the write operation (second) of a selected bit.

In the second write operation, a 0-write is performed for a selected bit for which the 0-write should be performed in the order below:

A write operation (0-write) is started by, as shown in FIG. 30, setting $V_{assist}$ to the first potential $V_1$ and $I_{SO}$ to the write current $I_{w\_p}$. The order thereof may be that, as shown in FIG. 30, $I_{SO}$ is set to the write current $I_{w\_p}$ after $V_{assist}$ is set to the first potential $V_1$ (steps $ST_{01} \rightarrow ST_{02}$) or $V_{assist}$ is set to the first potential $V_1$ after $I_{SO}$ is set to the write current $I_{w\_p}$ (steps $ST_{03} \rightarrow ST_{04}$).

Figure 31:
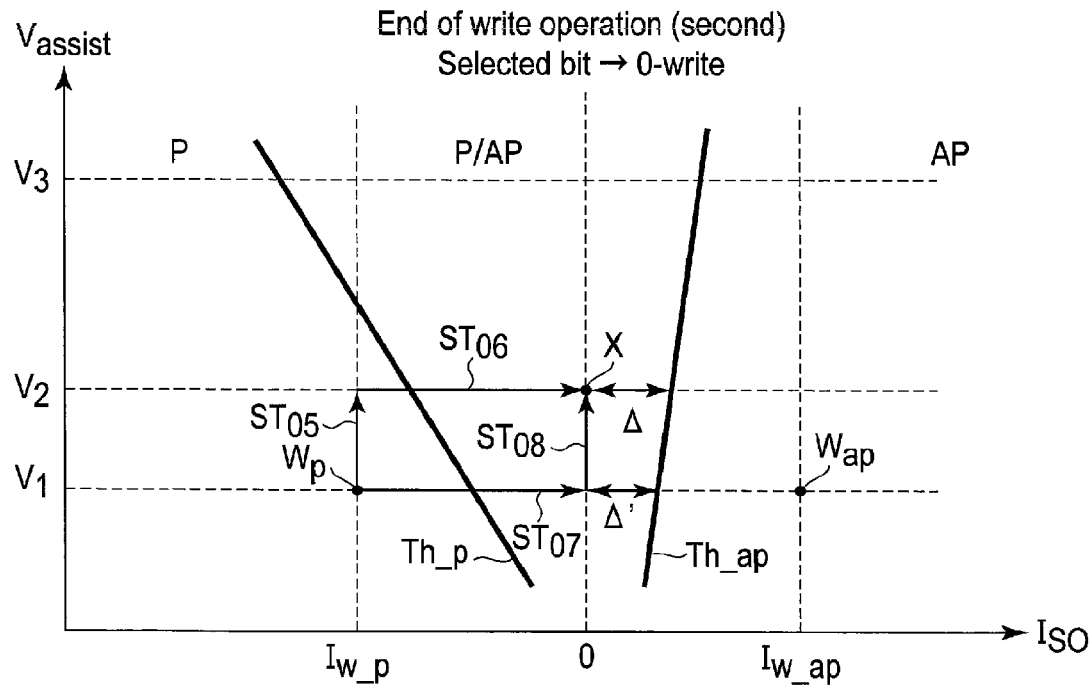
FIG. 31 is a diagram showing the end of the write operation (second) of the selected bit.

The write operation (0-write) is terminated by setting, as shown in FIG. 31, $V_{assist}$ to the second potential $V_2$ and then setting $I_{SO}$ to 0 (steps $ST_{05} \rightarrow ST_{06}$). This is because, as shown in FIG. 6, by taking the route from step $ST_{05}$ to step $ST_{06}$, the minimum margin between the route and the second threshold line Th_ap becomes $\Delta$.

When, for example, the route from step $ST_{07}$ to step $ST_{08}$ is taken, the minimum margin $\Delta$ becomes larger than a minimum margin $\Delta'$ between the route and the second threshold line Th_ap. Therefore, when the write operation (0-write) is terminated, a 1-write is not erroneously generated due to thermal disturbance or the like so that a write error rate can be reduced.

[Second Write Operation: Non-Selected Bit]

In the second write operation, a 0-write is performed for a non-selected bit for which the 0-write should not be performed in the order below:

A write operation (0-write) is started by, as shown in FIG. 32, setting $V_{assist}$ to the third potential $V_3$ and $I_{SO}$ to the write current $I_{w\_p}$. The order thereof is that, as shown in FIG. 32, $V_{assist}$ is set to the third potential $V_3$ and then $I_{SO}$ is set to the write current $I_{w\_p}$ (steps $ST_{21} \rightarrow ST_{22}$).

A point Y is positioned inside an area P/AP and thus, a 0-write will not be performed.

However, if $I_{SO}$ is set to the write current $I_{w\_p}$ and then $V_{assist}$ is set to the third potential $V_3$, the point is close to the first threshold line Th_p or through a point Z beyond Th_p in a process of moving from the point X to the point Y so that a 0-write may erroneously occur (steps $ST_{23} \rightarrow ST_{24}$).

Therefore, when a write operation (0-write) is started, it is desirable to set $V_{assist}$ to the third potential $V_3$ and then $I_{SO}$ to the write current $I_{w\_p}$ to reliably inhibit the occurrence of a 0-write of the non-selected bit.

The write operation (0-write) is terminated by setting, as shown in FIG. 33, $I_{SO}$ to 0 and then $V_{assist}$ to the second potential $V_2$ (steps $ST_{25} \rightarrow ST_{26}$). This is because, as shown in FIG. 33, by taking the route from step $ST_{25}$ to step $ST_{26}$, the route does not cross the first threshold line Th_p.

In contrast, if, for example, $V_{assist}$ is set to the second potential $V_2$ and then $I_{SO}$ is set to 0, the point is close to the first threshold line Th_p or through the point Z beyond Th_p in a process of moving from the point Y to the point X so that a 0-write erroneously occurs (steps $ST_{27} \rightarrow ST_{28}$).

Therefore, when the write operation (0-write) is terminated, it is desirable to shut off the write current $I_{w\_p}$ and then set $V_{assist}$ to the second potential $V_2$ to reliably inhibit the occurrence of a 0-write of the non-selected bit.

From the above, the write error rate can be reduced without the occurrence of an erroneous 0-write for a non-selected bit.

Fifth Embodiment

Figure 34:
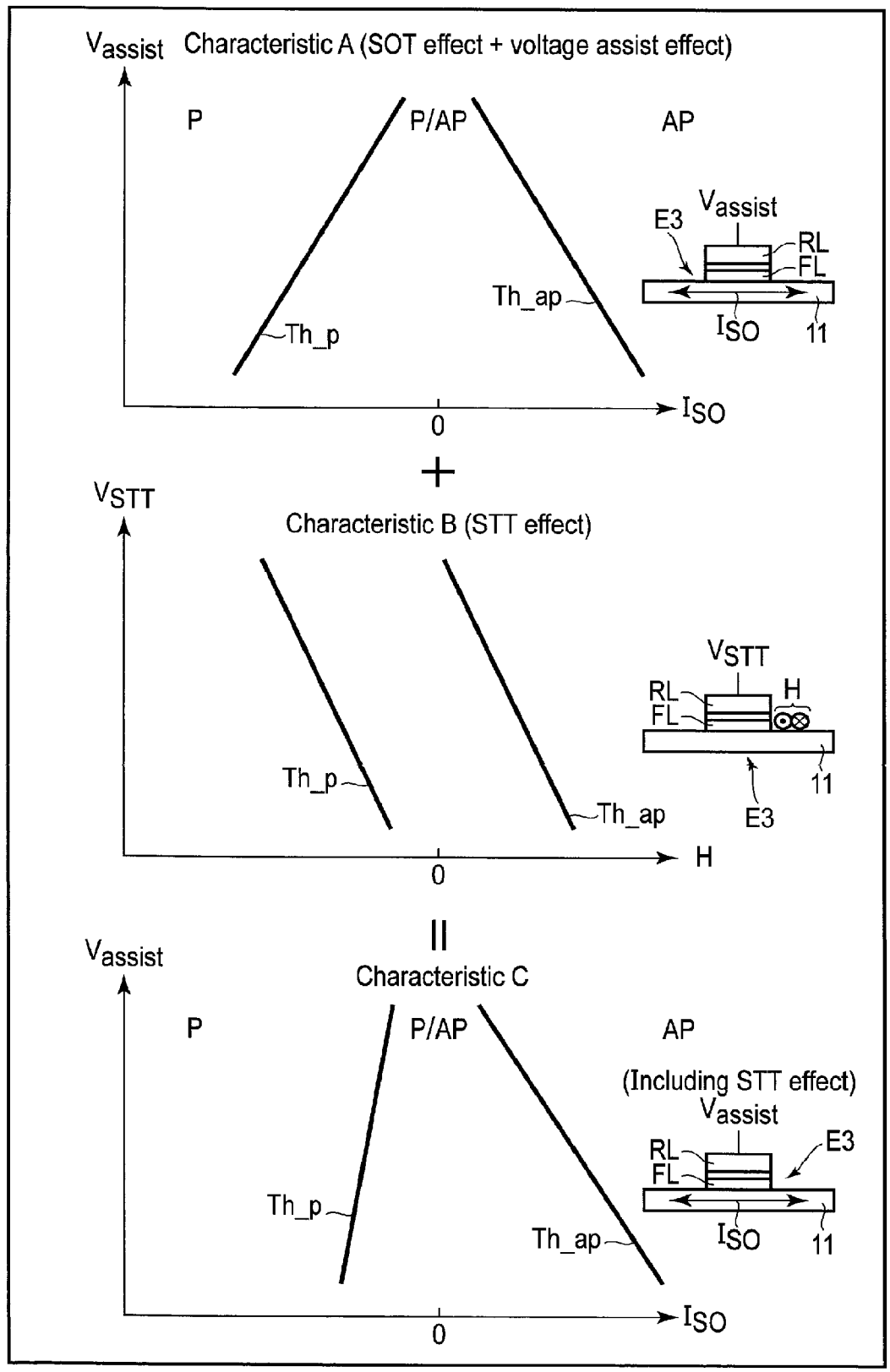
FIG. 34 is a diagram showing characteristics of a magnetic memory according to a fifth embodiment.

FIG. 34 shows characteristics of a magnetic memory according to a fifth embodiment.

For example, as shown in the upper diagram of FIG. 34, magnetization reversal characteristics of a magnetic memory in consideration of the SOT effect and voltage assist effect exhibit a state in which the first and second threshold lines Th_p, Th_ap are open downward. Also, in general, the first and second threshold lines Th_p, Th_ap are bilaterally symmetric with respect to $I_{SO}=0$.

However, if an assist potential $V_{assist}$ is applied to a second magnetic layer RL of a storage element, a flow of electrons in a vertical direction, that is, in a direction in which the first and second magnetic layers FL, RL are stacked arises, in the first storage layer FL, which causes the STT effect.

For example, if the assist potential $V_{assist}$ becomes increasingly higher than the potential of a third portion $E_3$ of a conductive wire 11, that is, with an increasing assist potential $V_{assist}$, the STT effect by electrons flowing from the first storage layer FL toward the second storage layer RL becomes conspicuous. In this case, electrons having a spin in a direction opposite to the magnetization direction of the second magnetic layer RL generate spin torque in the first storage layer FL and thus, the magnetization directions of the first and second storage layers FL, RL are more likely to be in an antiparallel state.

Therefore, as shown in the middle diagram of FIG. 34, magnetization reversal characteristics of the magnetic memory in consideration of the STT effect shift the first and second threshold lines Th_p, Th_ap to the left, that is, an antiparallel state is more likely to be entered and a parallel state is less likely to be entered with an increasing potential $V_{STT}$ applied to the second magnetic layer RL.

Similarly, if the assist potential $V_{assist}$ becomes increasingly lower than the potential of the third portion $E_3$ of the conductive wire 11, that is, with a decreasing assist potential $V_{assist}$, the STT effect by electrons flowing from the second storage layer RL toward the first storage layer FL becomes conspicuous. In this case, electrons having a spin in the same direction as the magnetization direction of the second magnetic layer RL generate spin torque in the first storage layer FL and thus, the magnetization directions of the first and second storage layers FL, RL are more likely to be in a parallel state.

Therefore, as shown in the middle diagram of FIG. 34, magnetization reversal characteristics of the magnetic memory in consideration of the STT effect shift the first and second threshold lines Th_p, Th_ap to the right, that is, a parallel state is more likely to be entered and an antiparallel state is less likely to be entered with a decreasing potential $V_{STT}$ applied to the second magnetic layer RL.

From the above, as shown in the lower diagram of FIG. 34, magnetization reversal characteristics of the magnetic memory in consideration of the SOT effect, the voltage assist effect, and the STT effect increase the inclination of the first threshold line Th_p indicating whether to enter a parallel state in a graph of $I_{SO}$ (x axis)–$V_{assist}$ (y axis) and decreases the inclination of the second threshold line Th_ap indicating whether to enter an antiparallel state.

This means that with decreasing $V_{assist}$, the first and second magnetic layers FL, RL are less likely to enter an antiparallel state. That is, it becomes easier to switch selected bits and non-selected bits in a 1-write (write operation to put a storage element into an antiparallel state) using the inclination of the second threshold line Th_ap. On the other hand, it becomes more difficult to switch selected bits and non-selected bits in a 0-write (write operation to put a storage element into a parallel state).

Therefore, for example, in the write operation described in the third embodiment, it is desirable to write 0 into all of multiple bits (eight bits) by setting the 0-write as the write operation (first). Also, by setting the 1-write as the write operation (second), 1 can be selectively written into multiple bits (eight bits) using the inclination of the second threshold line Th_ap in FIG. 35.

As a result, the write error rate is further reduced in a write operation of the third embodiment. To make the STT effect more conspicuous and improve bit selectivity (make the inclination of the second threshold line Th_ap still smaller), for example, techniques of reducing a resistance-area product (RA) of the storage element MTJ or increasing the spin polarization rate of the first and second magnetic layers FL, RL may be combined.

Regarding the STT effect, in contrast to the above description, a parallel state may also be likely to be entered when electrons flow from the first magnetic layer FL toward the second magnetic layer RL and an antiparallel state may also be likely to be entered when electrons flow from the second magnetic layer RL toward the first magnetic layer FL.

In such a case, the middle diagram of the FIG. 34 changes to characteristics in which a parallel state is more likely to be entered with increasing $V_{STT}$ and an antiparallel state is more likely to be entered with decreasing $V_{STT}$. As a result, the lower diagram of FIG. 34 changes to characteristics in which the inclination of the first threshold line Th_p decreases and the inclination of the second threshold line Th_ap increases.

Therefore, in such a case, the 1-write may be set as the write operation (first) and the 0-write may be set as the write operation (second).

Which trend of the above two cases the STT effect exhibits depends on, for example, band filling of the magnetic material used for the first magnetic layer FL to the 3d orbit.

Next, examples of the write operation will be described.

[First Write Operation (all Bits: 0-Write)]

In the first write operation, a 0-write is performed for multiple bits (all bits).

A write operation (0-write) is started by, as shown in FIG. 35, setting $V_{assist}$ to the first potential $V_1$ and $I_{SO}$ to the write current $I_{w\_p}$. The order thereof may be that, as shown in FIG. 35, $I_{SO}$ is set to the write current $I_{w\_p}$ after $V_{assist}$ is set to the first potential $V_1$ (steps $ST_{01} \rightarrow ST_{02}$) or $V_{assist}$ is set to the first potential $V_1$ after $I_{SO}$ is set to the write current $I_{w\_p}$ (steps $ST_{03} \rightarrow ST_{04}$).

The write operation (0-write) is terminated by setting, as shown in FIG. 36, $V_{assist}$ to the second potential $V_2$ and then $I_{SO}$ to 0 (steps $ST_{05} \rightarrow ST_{06}$). This is because, as shown in FIG. 6, by taking the route from step $ST_{05}$ to step $ST_{06}$, the minimum margin between the route and the second threshold line Th_ap becomes Δ.

When, for example, the route from step $ST_{07}$ to step $ST_{08}$ is taken, the minimum margin Δ becomes larger than a minimum margin Δ' between the route and the second threshold line Th_ap. Therefore, when the write operation (0-write) is terminated, a 1-write is not erroneously generated due to thermal disturbance or the like so that a write error rate can be reduced.

[Second Write Operation: Selected Bit]

Figure 37:
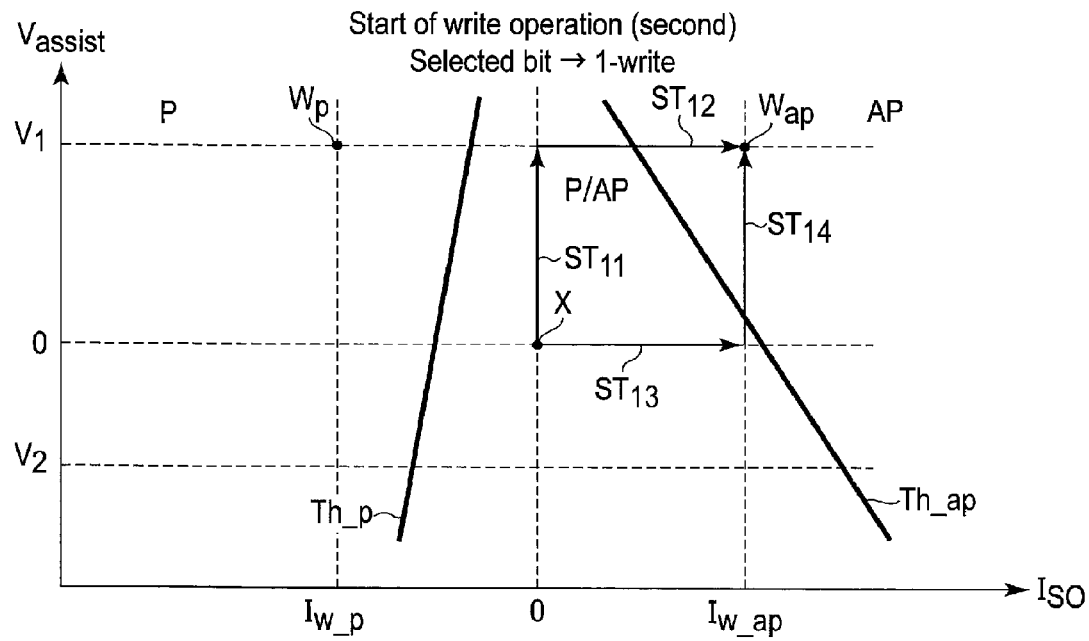
FIG. 37 is a diagram showing the start of the write operation (second) of the selected bit.

In the second write operation, a 1-write is performed for a selected bit for which the 1-write should be performed in the order below:

A write operation (1-write) is started by, as shown in FIG. 37, setting $V_{assist}$ to the first potential $V_1$ and $I_{SO}$ to the write current $I_{w\_ap}$. The order thereof may be that, as shown in FIG. 37, $I_{SO}$ is set to the write current $I_{w\_ap}$ after $V_{assist}$ is set to the first potential $V_1$ (steps $ST_{11} \rightarrow ST_{12}$) or $V_{assist}$ is set to the first potential $V_1$ after $I_{SO}$ is set to the write current $I_{w\_ap}$ (steps $ST_{13} \rightarrow ST_{14}$).

Figure 38:
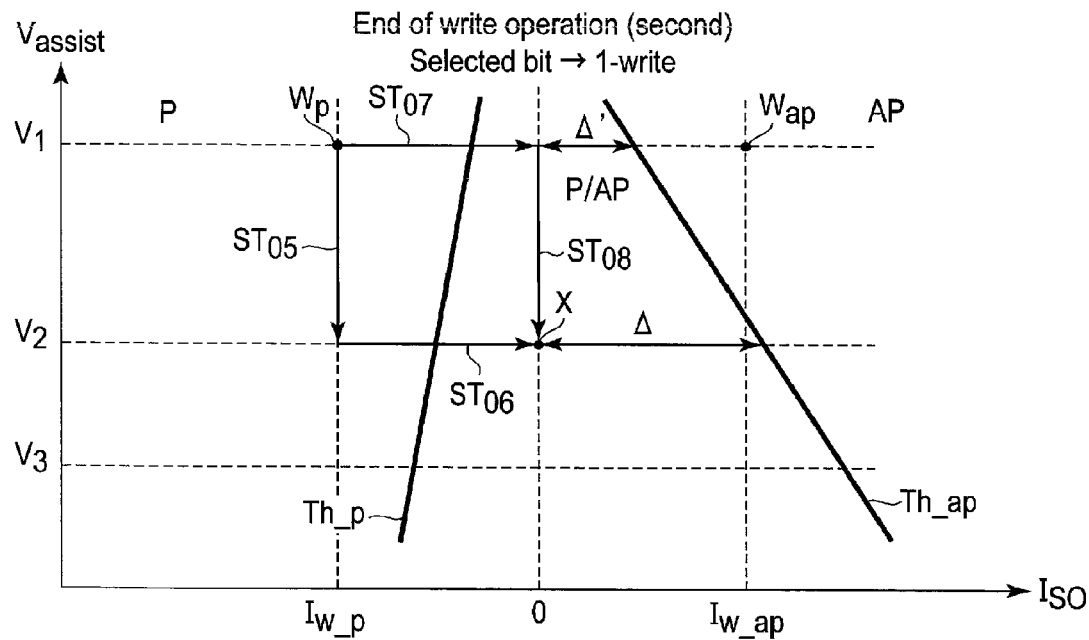
FIG. 38 is a diagram showing the end of the write operation (second) of the selected bit.

The write operation (1-write) is terminated by, as shown in FIG. 38, setting $V_{assist}$ to the second potential $V_2$ and then $I_{SO}$ to 0 (steps $ST_{15} \rightarrow ST_{16}$). This is because, as shown in FIG. 38, by taking the route from step $ST_{15}$ to step $ST_{16}$, the minimum margin between the route and the first threshold line Th_p becomes Δ.

When, for example, the route from step $ST_{17}$ to step $ST_{18}$ is taken, the minimum margin $\Delta$ becomes larger than a minimum margin $\Delta'$ between the route and the first threshold line Th_p. Therefore, when the write operation (1-write) is terminated, a 0-write is not erroneously generated due to thermal disturbance or the like so that a write error rate can be reduced.

[Second Write Operation: Non-Selected Bit]

Figure 39:
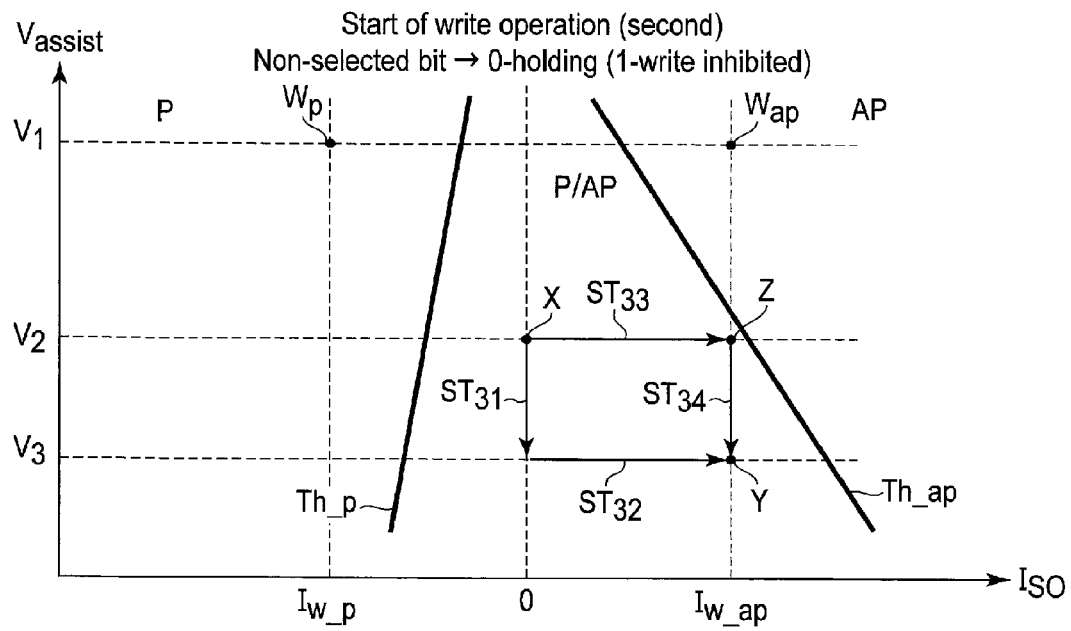
FIG. 39 is a diagram showing the start of the write operation (second) of the non-selected bit.

In the second write operation, a 1-write is performed for a non-selected bit for which the 1-write should not be performed in the order below:

A write operation (1-write) is started by, as shown in FIG. 39, setting $V_{assist}$ to the third potential $V_3$ and $I_{SO}$ to the write current $I_{w\_ap}$. The order thereof is that, as shown in FIG. 39, $V_{assist}$ is set to the third potential $V_3$ and then $I_{SO}$ is set to the write current $I_{w\_ap}$ (steps $ST_{31} \rightarrow ST_{32}$).

The point Y is positioned inside the area P/AP and thus, a 1-write will not be performed.

However, if $I_{SO}$ is set to the write current $I_{w\_ap}$ and then $V_{assist}$ is set to the third potential $V_3$, the point is close to the second threshold line Th_ap or through the point Z beyond Th_ap in a process of moving from the point X to the point Y so that a 1-write may erroneously occur (steps $ST_{33} \rightarrow ST_{34}$).

Therefore, when a write operation (1-write) is started, it is desirable to set $V_{assist}$ to the third potential $V_3$ and then $I_{SO}$ to the write current $I_{w\_ap}$ to reliably inhibit the occurrence of a 1-write of the non-selected bit.

Figure 40:
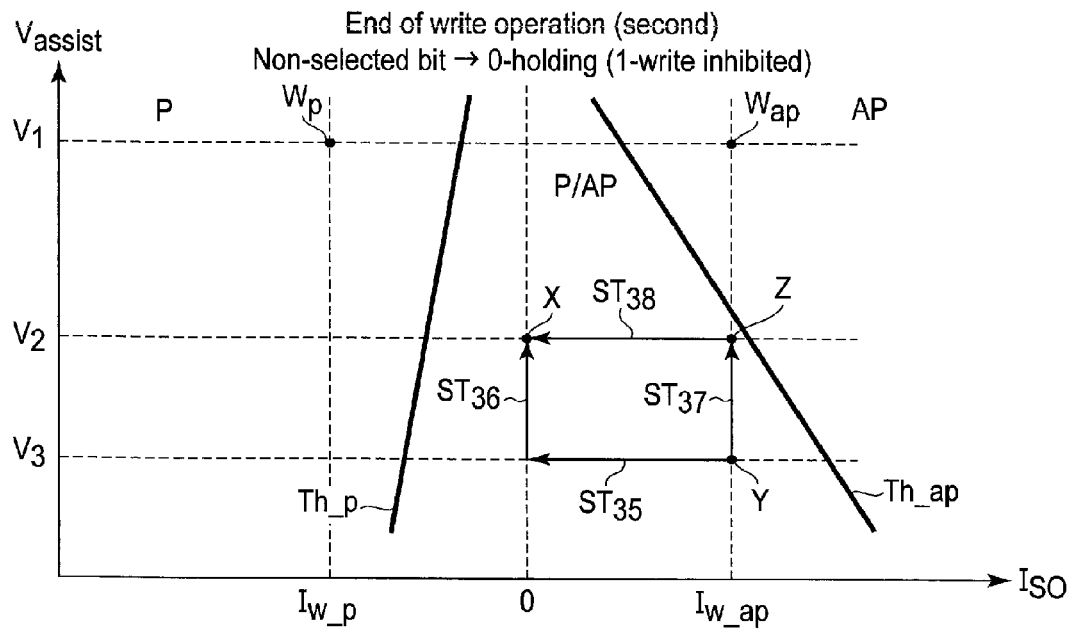
FIG. 40 is a diagram showing the end of the write operation (second) of the non-selected bit.

The write operation (1-write) is terminated by, as shown in FIG. 40, setting $I_{SO}$ to 0 and then $V_{assist}$ to the second potential $V_2$ (steps $ST_{35} \rightarrow ST_{36}$). This is because, as shown in FIG. 40, by taking the route from step $ST_{35}$ to step $ST_{36}$, the route does not cross the second threshold line Th_ap.

In contrast, if, for example, $V_{assist}$ is set to the second potential $V_2$ and then $I_{SO}$ is set to 0, the point is close to the second threshold line Th_ap or through the point Z beyond the second threshold line Th_ap in a process of moving from the point Y to the point X so that a 1-write erroneously occurs (steps $ST_{37} \rightarrow ST_{38}$).

Therefore, when the write operation (1-write) is terminated, it is desirable to shut off the write current $I_{w\_ap}$ and then set $V_{assist}$ to the second potential $V_2$ to reliably inhibit the occurrence of a 1-write of the non-selected bit.

From the above, the write error rate can be reduced without the occurrence of an erroneous 1-write for a non-selected bit.

SUMMARY

According to an embodiment, as described above, the write error rate of a magnetic memory can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory comprising:
a conductive line including a first portion, a second portion and a third portion therebetween;
a storage element including a first magnetic layer, a second magnetic layer and a nonmagnetic layer therebetween, and the first magnetic layer being connected to the third portion; and
a circuit electrically connected to the first portion, the second portion and the second magnetic layer, and flowing a write current between the first and second portions, applying a first potential to the second magnetic layer, and blocking the write current flowing between the first and second portions after changing the second magnetic layer from the first potential to a second potential.

2. The memory of claim 1, wherein
the circuit writes a first data to the storage element by flowing the write current from the first portion to the second portion.

3. The memory of claim 2, wherein
the circuit writes a second data to the storage element by flowing the write current from the second portion to the first portion.

4. The memory of claim 1, wherein
the first potential is different from a potential of the third portion while the write current flows between the first and second portions.

5. The memory of claim 1, wherein
polarity of the second potential is the opposite of polarity of the first potential.

6. A nonvolatile memory comprising:
a conductive line including a first portion, a second portion and a third portion therebetween;
a storage element including a first terminal and a second terminal, and the first terminal being connected to the third portion; and
a circuit electrically connected to the first portion, the second portion and the second magnetic layer, and flowing a write current between the first and second portions, applying a first potential to the second terminal, and blocking the write current flowing between the first and second portions after changing the second terminal from the first potential to a second potential.

7. The memory of claim 6, wherein
the circuit writes a first data to the storage element by flowing the write current from the first portion to the second portion.

8. The memory of claim 7, wherein
the circuit writes a second data to the storage element by flowing the write current from the second portion to the first portion.

9. The memory of claim 6, wherein
the first potential is different from a potential of the third portion while the write current flows between the first and second portions.

10. The memory of claim 6, wherein
polarity of the second potential is the opposite of polarity of the first potential.

11. A nonvolatile memory comprising:
a conductive line including a first portion, a second portion, a third portion and a fourth portion, the third portion being provided between the first and second portions, and the fourth portion being provided between the second and third portions;
a first storage element including a first terminal and a second terminal, and the first terminal being connected to the third portion;
a second storage element having a third terminal and a fourth terminal, and the third terminal being connected to the fourth portion; and a circuit flowing a write current between the first and second portions, applying a first potential to the second terminal, and blocking the write current flowing between the first and second portions after changing the second terminal from the first potential to a second potential.

12. The memory of claim 11, wherein the circuit applies a third potential different from the first potential to the fourth terminal or sets the fourth terminal to a floating state while the write current flows between the first and second portions.

13. The memory of claim 12, wherein the circuit applies the third potential to the fourth terminal or sets the fourth terminal to the floating state before the write current flows between the first and second portions.

14. The memory of claim 13, wherein the circuit changes the fourth terminal from the third potential or the floating state to the second potential after the write current between the first and second portions is blocked.

15. The memory of claim 11, wherein the circuit applies the first potential to the second and fourth terminals while the write current flows from the first portion to the second portion.

16. The memory of claim 15, wherein the circuit flows the write current from the second portion to the first portion after flowing the write current from the first portion to the second portion, and applies the first potential to the fourth terminal while the write current flows from the second portion to the first portion.

17. The memory of claim 16, wherein the circuit applies a third potential different from the first potential to the second terminal or sets the second terminal to a floating state while the write current flows from the second portion to the first portion.

18. The memory of claim 11, wherein the first potential is different from a potential of the third portion while the write current flows between the first and second portions.

19. The memory of claim 11, wherein polarity of the second potential is the opposite of polarity of the first potential.

20. The memory of claim 11, wherein each of the first and second storage elements includes a first magnetic layer, a second magnetic layer, and a nonmagnetic layer between the first and second magnetic layers, and the first magnetic layer contacts with the third portion.

* * * * *